(12) United States Patent
Koizumi

(10) Patent No.: US 11,522,145 B2
(45) Date of Patent: Dec. 6, 2022

(54) METHOD FOR MANUFACTURING TRANSISTOR COMPRISING REMOVAL OF OXIDE FILM

(71) Applicant: NIKON CORPORATION, Tokyo (JP)

(72) Inventor: Shohei Koizumi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/168,830

(22) Filed: Feb. 5, 2021

(65) Prior Publication Data
US 2021/0226143 A1    Jul. 22, 2021

Related U.S. Application Data

(63) Continuation of application No. PCT/JP2019/006697, filed on Feb. 22, 2019.

(30) Foreign Application Priority Data

Aug. 8, 2018    (JP) .............................. JP2018-148987

(51) Int. Cl.
*H01L 51/05*    (2006.01)
*H01L 51/10*    (2006.01)

(52) U.S. Cl.
CPC ........ *H01L 51/0545* (2013.01); *H01L 51/105* (2013.01)

(58) Field of Classification Search
None
See application file for complete search history.

(56) References Cited

U.S. PATENT DOCUMENTS

| 2009/0134393 | A1 | 5/2009 | Gotoh et al. |
| 2010/0032660 | A1 | 2/2010 | Nomoto et al. |
| 2010/0055832 | A1 | 3/2010 | Akimoto et al. |
| 2012/0037907 | A1 | 2/2012 | Whiting et al. |
| 2013/0161602 | A1 | 7/2013 | James et al. |
| 2013/0277661 | A1 | 10/2013 | Oseki |
| 2015/0053988 | A1* | 2/2015 | Li .................... H01L 27/1214 438/669 |

(Continued)

FOREIGN PATENT DOCUMENTS

| JP | 2002-64101 A | 2/2002 |
| JP | 2006-324368 A | 11/2006 |
| JP | 2010-40897 A | 2/2010 |

(Continued)

OTHER PUBLICATIONS

International Search Report dated May 21, 2019, in corresponding International Patent Application No. PCT/JP2019/006697.

(Continued)

*Primary Examiner* — Daniel Whalen

(57) ABSTRACT

A method for manufacturing a transistor being a bottom-gate transistor is provided. The method for manufacturing a transistor includes a step of forming a first metal layer 32 on an insulator layer 20 provided on a substrate 10 including a gate electrode, a step of applying a resist onto the first metal layer 32, and patterning the first metal layer 32 by a photolithographic method, an oxide film removal step of removing an oxide film 26 formed on the patterned first metal layer 32, and a step of forming a source electrode and a drain electrode by forming a second metal layer 42 on the first metal layer 32.

16 Claims, 15 Drawing Sheets

(56) References Cited

U.S. PATENT DOCUMENTS

2018/0175300 A1\* 6/2018 Yamamoto .......... H01L 51/0041

FOREIGN PATENT DOCUMENTS

| JP | 2010-80954 A | 4/2010 |
| JP | 2012-516560 A | 7/2012 |
| JP | 2013-534726 A | 9/2013 |
| WO | WO 2007/063991 A1 | 6/2007 |
| WO | WO 2012/086609 A | 6/2012 |
| WO | WO 2013/176247 A1 | 11/2013 |

OTHER PUBLICATIONS

Office Action, dated Jul. 1, 2020, in counterpart Taiwan Patent Application No. 10920613560 (16 pp.).
Office Action, dated Mar. 8, 2022, in counterpart Japanese Patent Application No. 2020-535487 (11 pp.).

\* cited by examiner

METHOD FOR MANUFACTURING TRANSISTOR COMPRISING REMOVAL OF OXIDE FILM

TECHNICAL FIELD

The present invention relates to a method for manufacturing a transistor. The present invention claims priority to Japanese Patent Application No. 2018-148987, filed on Aug. 8, 2018, the contents of which are incorporated by reference herein in its entirety in designated states where the incorporation of documents by reference is approved.

BACKGROUND ART

A transistor is used as one type of a semiconductor element. In terms of a structure thereof, a transistor can be classified into a bottom-gate transistor having a structure in which a gate electrode is disposed below a semiconductor layer, a top-gate transistor having a structure in which a gate electrode is disposed above a semiconductor layer, and the like.

As a technique related to this, PTL 1 discloses a configuration in which a bottom-gate thin-film transistor includes a substrate, a gate electrode wiring line, a gate insulating film, a first semiconductor layer serving as a channel, a second semiconductor layer serving as first and second contact layers, and a source or drain electrode wiring line, and an insulating semiconductor layer is formed in an exposed portion of the second semiconductor layer exposed from the source or drain electrode wiring line. For example, it is preferable that a contact resistance between a semiconductor layer and source/drain electrodes is low in order to achieve excellent transistor performance.

CITATION LIST

Patent Literature

PTL 1: JP 2013-105873 A

SUMMARY OF INVENTION

A first aspect of the present invention is a method for manufacturing a transistor being a bottom-gate transistor, the method including: a step of forming a first metal layer on an insulator layer provided on a substrate including a gate electrode or on a semiconductor layer provided on a substrate including a gate electrode and an insulator layer; a patterning step of applying a resist onto the first metal layer, and patterning the first metal layer by a photolithographic method; an oxide film removal step of removing an oxide film formed on the patterned first metal layer; and a step of forming a source electrode and a drain electrode by forming a second metal layer on the first metal layer.

A second aspect of the present invention is a method for manufacturing a transistor being a top-gate transistor, the method including: a step of forming a first metal layer on a substrate or on a semiconductor layer provided on a substrate; a patterning step of applying a resist onto the first metal layer, and patterning the first metal layer by a photolithographic method; an oxide film removal step of removing an oxide film formed on the patterned first metal layer; and a step of forming a source electrode and a drain electrode by forming a second metal layer on the first metal layer.

DESCRIPTION OF EMBODIMENTS

Figure 1A:
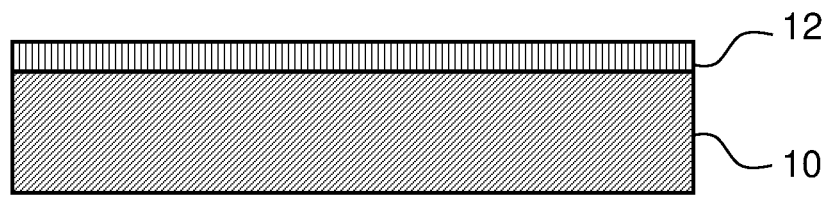
FIGS. 1(A) to 1(D) are schematic diagrams provided for description of a method for manufacturing a bottom-gate transistor according to the present embodiment, and are schematic diagrams illustrating steps of forming a gate electrode on a substrate.

Hereinafter, an embodiment for implementing the present invention (hereinafter, simply referred to as the "present embodiment") will be described in detail. The present embodiment described below is an example for describing the present invention, and is not intended to limit the present invention to the contents described below. In the following embodiments, description is divided for each of the embodiments when needed for the sake of convenience, but they are not irrelevant to each other except when specified otherwise, and one of them is relevant to a modification example, details, a supplementary explanation, and the like of a part or the whole of the other.

In a case where the number and the like (including the number, a numerical value, quantity, a range, and the like) of elements are mentioned in the following embodiments, the present invention is not limited to a specific number except when specified otherwise, when the present invention is clearly limited to the specific number in theory, and the like, and may be equal to, greater than, or less than the specific number. Furthermore, in the following embodiments, it is needless to say that a component (also including an element step and the like) thereof is not always necessary except when specified otherwise, when it is conceivable that the component is clearly necessary in theory, and the like.

Similarly, in a case where a shape, a positional relationship, and the like of a component are mentioned in the following embodiments, a shape and the like substantially close or similar to the shape and the like of the component are included except when specified otherwise, when it is clearly not conceivable in theory, and the like. The same also applies to the numerical value and the range described above.

Furthermore, in all diagrams for describing the embodiments, the same member is provided with the same reference sign in principle, and repetitive description thereof will be omitted. Hatching may be provided to even a plan view to make the diagram easier to understand.

<Method for Manufacturing Bottom-Gate Transistor>

A first embodiment is a method for manufacturing a bottom-gate transistor, and includes
(1) a step of forming a first metal layer on an insulator layer provided on a substrate including a gate electrode or on a semiconductor layer provided on a substrate including a gate electrode (G electrode) and an insulator layer,
(2) a step of applying a resist onto the first metal layer, and patterning the first metal layer by a photolithographic method,
(3) an oxide film removal step of removing an oxide film formed on the patterned first metal layer, and
(4) a step of forming a source electrode (S electrode) and a drain electrode (D electrode) by forming a second metal layer on the first metal layer after the oxide film removal step.

Hereinafter, for (1) step, a case (bottom-gate bottom-contact transistor) where a metal film 12 is formed as a first metal layer on an insulator layer provided on a substrate including a gate electrode will be described as an example. However, a case (bottom-gate top-contact transistor) where a first metal layer is formed on a semiconductor layer provided on a substrate including a gate electrode and an insulator layer can also be implemented according to a method indicated below.

FIGS. 1 to 8 are schematic diagrams provided for description of a method for manufacturing a bottom-gate transistor according to the present embodiment.

FIGS. 1(A) to 1(D) are schematic diagrams illustrating steps of forming a gate electrode on a substrate 10.

((1) Step)

First, a metal film 12 constituting the gate electrode later is formed on the substrate 10. The substrate 10 may have optical transparency, or may not have optical transparency. Examples of a material of the substrate 10 include an inorganic substance such as glass, quartz glass, silicon, silicon nitride, and stainless steel, and an organic substance such as an acrylic resin, a polycarbonate resin, a polyester resin, such as polyethylene terephthalate (PET), polybutylene terephthalate (PBT), and polyethylene naphtalate (PEN), a polyethylene resin, a polypropylen resin, an ethylene-vinyl copolymer resin, a polyvinyl chloride resin, a cellulosic resin, a polyamide resin, a polyimide resin, a polycarbonate resin, a polystyrene resin, and a vinyl acetate resin.

In a case where a flexible substrate suitable for a so-called roll-to-roll process is used, a thickness and rigidity (Young's modulus) of the substrate 10 may fall in a range that no bend and no irreversible wrinkle occur in the substrate 10 due to buckling when the substrate 10 passes through a conveyance path of an exposure device and the like, and PET, PEN, polyimide, and the like are preferable as a material of the substrate 10. Then, it is preferable that a thickness of the substrate 10 is 25 μm to 200 μm.

Since the substrate 10 may receive heat in processing performed on the substrate 10, it is preferable to select the substrate 10 formed of a material that does not significantly have a great coefficient of thermal expansion. For example, a coefficient of thermal expansion can be suppressed by mixing an inorganic filler in a resin film. The inorganic filler may be, for example, titanium oxide, zinc oxide, alumina, silicon oxide, and the like.

The substrate 10 may be a single-layer body of an extremely thin glass having a thickness of about 100 μm manufactured by a float method and the like, or may be a laminated body acquired by bonding the resin film described above, foil, and the like to the extremely thin glass.

As a material of the metal film 12, a material that can be formed on the substrate 10 may be used, and examples of the material include copper, gold, nickel, aluminum, and the like. Formation onto the substrate 10 is not particularly limited, and can be performed by a method such as deposition, plating, and sputtering, for example (see FIG. 1(A)). When the metal film 12 is formed by plating, electroless plating can be performed. The metal film 12 constitutes the gate electrode described later.

((2) Step)

Figure 1B:
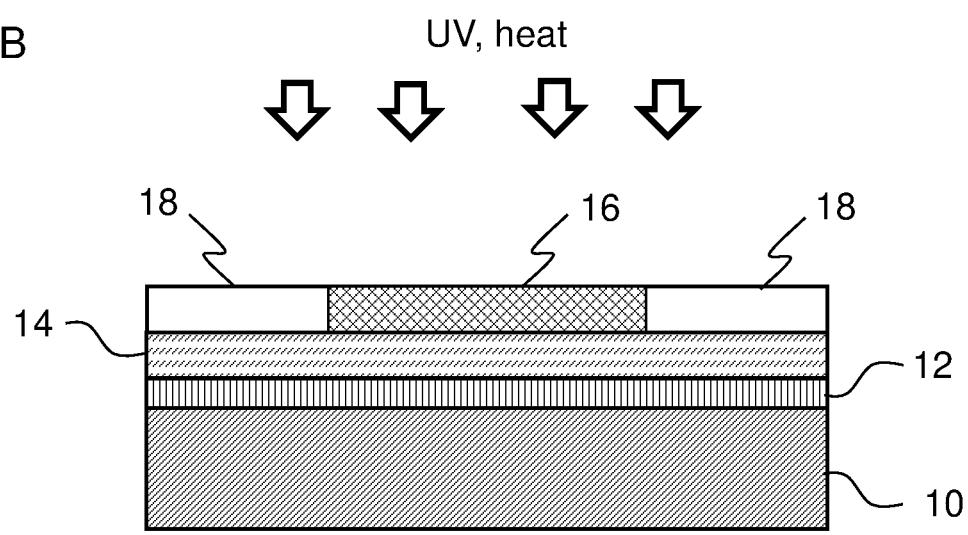

Next, as illustrated in FIG. 1(B), a positive resist 14 is formed on the metal film 12. The resist 14 can be formed by applying a photoresist material onto the metal film 12 and pre-baking the photoresist material. Next, a mask 16 in which an opening 18 is formed corresponding to a predetermined pattern is disposed on the resist 14. At this time, the mask 16 may be disposed in contact with the resist 14, or may be disposed with a predetermined gap without contacting the resist 14. Then, the resist 14 is exposed by irradiation with ultraviolet light (UV light) via the mask 16.

Figure 1C:
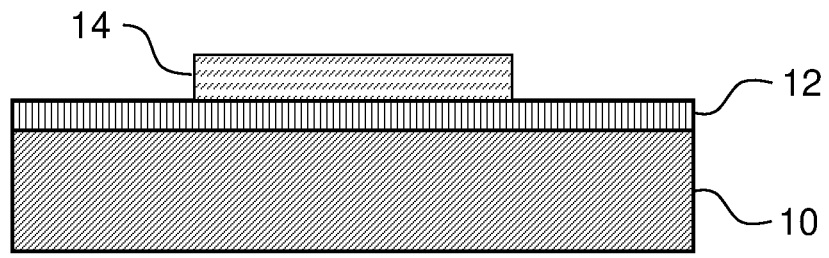

Then, as illustrated in FIG. 1(C), a portion (exposed portion) of the resist 14 irradiated with UV light is dissolved and removed by dipping the resist 14 in a developing solution (for example, tetramethyl ammonium hydroxide (TMAH) and the like).

Figure 1D:
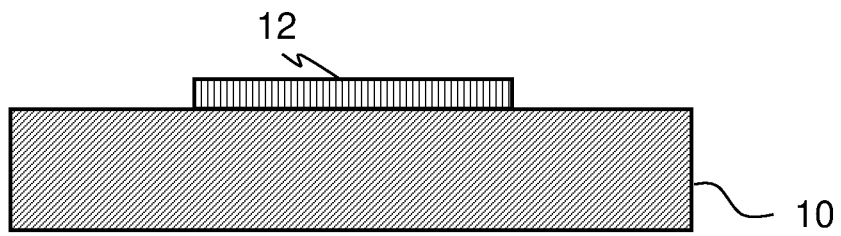

Subsequently, a portion of the metal film 12 on which the resist 14 is not formed is removed by bringing an etchant into contact with the metal film 12. Then, the remaining resist 14 is irradiated with UV light and brought into contact with the developing solution again, and thus the resist 14 is removed from the substrate. In this way, as illustrated in FIG. 1(D), the metal film 12 formed in a predetermined pattern corresponding to the gate electrode is acquired. Note that, after the resist 14 is removed, a drying step for removing the remaining developing solution may be performed. Note that the drying step may be drying by heat treatment, or may be natural drying.

Figure 2A:
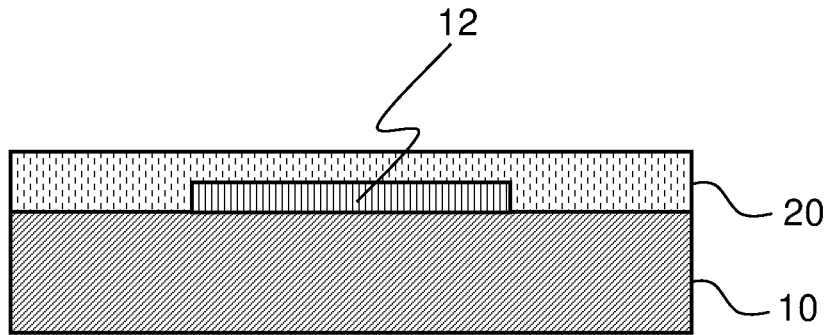
FIGS. 2(A) to 2(C) are schematic diagrams provided for description of the method for manufacturing a bottom-gate transistor according to the present embodiment, and are schematic diagrams illustrating steps of forming an insulator layer on the substrate.
Figure 2B:
Figure 2B:
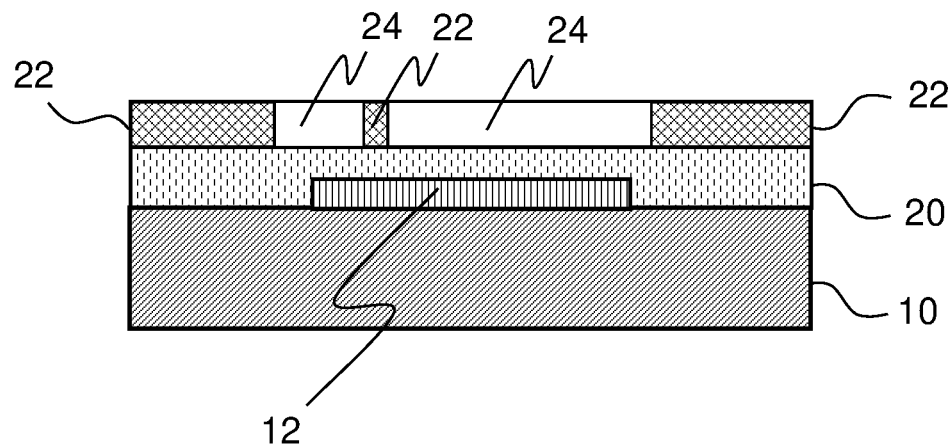
Figure 2C:
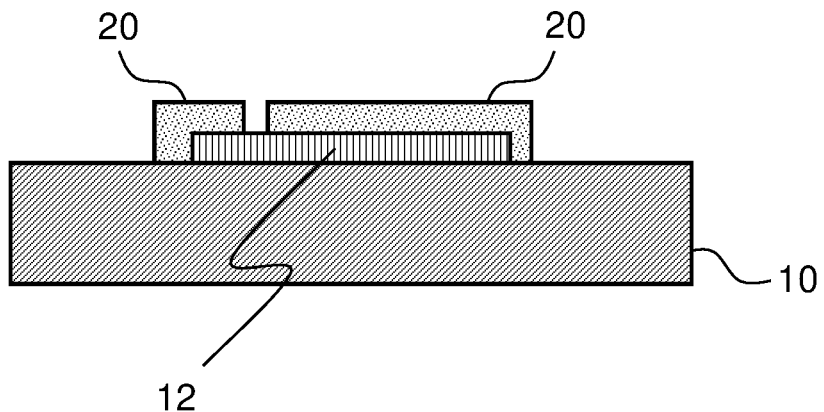

FIGS. 2(A) to 2(C) are schematic diagrams illustrating steps of forming an insulator layer 20 on the substrate 10.

Next, as illustrated in FIG. 2(A), the insulator layer 20 is formed on the substrate 10. The insulator layer 20 is formed of a photo-curable resin having an insulating property, for example. Examples of such a photo-curable resin include a UV photo-curable acrylic resin, a UV photo-curable epoxy resin, a UV photo-curable enethiol resin, a UV photo-curable silicone resin, and the like. By using a photo-curable resin, patterning of the insulator layer 20 can also be performed by irradiation with UV light. Note that, as a material of the insulator layer 20, a photo-curable resin may not be necessarily used and a thermosetting resin may be used, and a resin material may not be necessarily used and an oxide film and the like may be used. However, hereinafter, a case where the insulator layer 20 is formed by using a photo-curable resin will be described.

Subsequently, as illustrated in FIG. 2(B), the insulator layer 20 is irradiated with UV light via a mask 22 in which a predetermined pattern is formed (a mask having an opening 24 corresponding to a region in which the insulator layer 20 is desired to be formed). As a result, the insulator layer 20 in a region irradiated with UV light (the region in which the insulator layer 20 is desired to be formed) is cured. The insulator layer 20 can be selectively cured by using such a mask, but the insulator layer 20 may be cured by direct selective irradiation with UV light by a direct drawing exposure device. Note that, after irradiation with UV light, it is more suitable to apply heat treatment for facilitating a chemical reaction in the region irradiated with UV light.

Then, as illustrated in FIG. 2(C), the insulator layer 20 having the pattern corresponding to the mask opening 24 is formed by dissolving and removing, by the developing solution, a portion without irradiation with UV light. In other words, the portion of the insulator layer 20 cured by irradiation with UV light remains. After development, heat treatment (post-bake) may be further performed as necessary. In this way, a residue of the developing solution can be suppressed, and performance of the insulator layer 20 can become stable.

By the steps above, the insulator layer 20 can be formed on the metal film 12 to be the gate electrode. Note that a thickness of the insulator layer 20 is preferably a few 100 nanometers from a viewpoint of suppressing a leak of a current between a gate electrode (G electrode) and source/drain electrodes (SD electrodes). A thickness of the insulator layer 20 can be controlled by concentration and an application condition of resin. The insulator layer 20 can also be formed by patterning such as a printing method of a material such as a photo-curable resin and a thermosetting resin. Thus, a material that has an insulating property and can be applied is applicable.

Figure 3A:
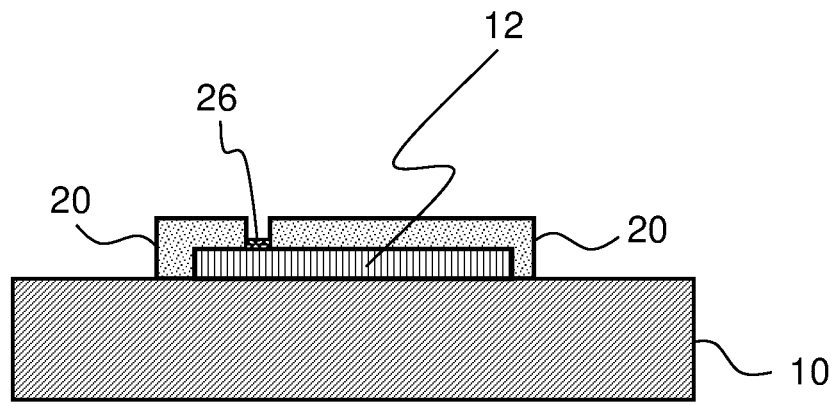
FIGS. 3(A) to 3(C) are schematic diagrams provided for description of the method for manufacturing a bottom-gate transistor according to the present embodiment, and are schematic diagrams illustrating steps of removing an oxide film.
Figure 3B:
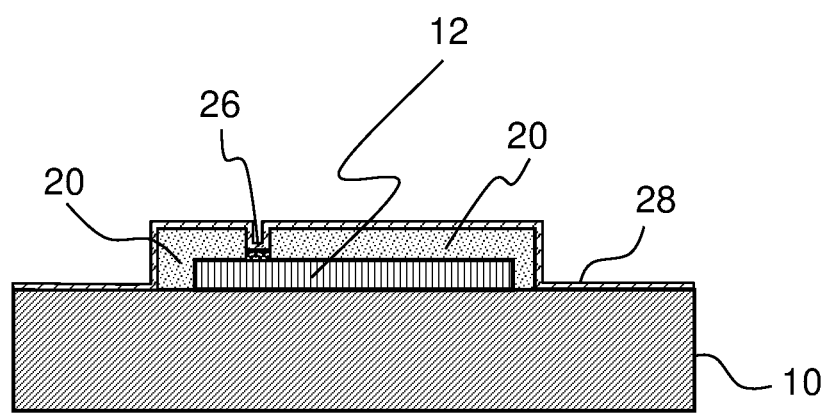
Figure 3C:
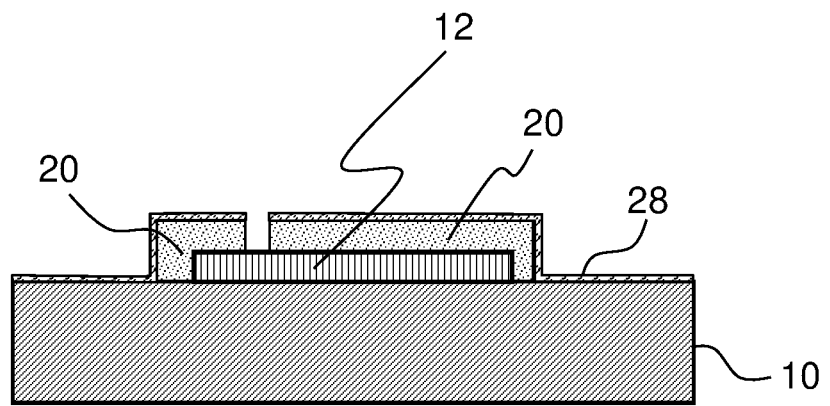

FIGS. 3(A) to 3(C) are schematic diagrams illustrating steps of removing an oxide film.

((3) Step)

Here, as illustrated in FIG. 3(A), there is a case where an oxide film 26 is formed in an opening and the like of the insulator layer 20. Thus, after a plating base film 28 is formed on a surface of the insulator layer 20 and the substrate 10 as illustrated in FIG. 3(B), the oxide film 26 is removed as illustrated in FIG. 3(C).

First, the plating base film 28 is formed on the surface of the insulator layer 20 and the substrate 10. The plating base film 28 facilitates an electroless plating step described later. The plating base film 28 can be formed by applying an amine solution acquired by adding a solvent to a silane coupling agent (amine molecule) having a primary amino group or a secondary amino group, for example. In other words, the plating base film 28 in this case includes an amine-based silane coupling agent. Such a plating base film 28 can capture a plating catalyst described later in an excellent manner.

As a method of application, a normally known method such as spin coating, dip coating, spray coating, roll coating, brush coating, flexographic printing, and screen printing can be used. After application, the plating base film 28 is formed by volatilizing the solvent by heat treatment.

Next, the oxide film 26 is removed. The oxide film 26 is an oxide film of the metal film 12 described above, and is formed on the surface of the opening and the like. For example, when a copper film is used as the metal film 12, a copper oxide is formed in the opening and the like. In a normal manufacturing step, post-bake, drying processing after plating processing and cleaning, and the like may be performed, but it is conceivable that the oxide film 26 is formed by heating in such processing. Thus, in the step described above, the oxide film 26 may be generated by post-bake after the insulator layer 20 is formed in FIG. 2(C).

The oxide film 26 makes it difficult to ionize metal, and becomes a cause of prevention of plating in a plating step described later. Thus, excellent deposition of plating can be achieved by removing the oxide film 26 in advance, and a transistor having excellent operation stability can be acquired. Note that a so-called passive film and the like are also included in the oxide film 26 in the present embodiment, and such a film may also be a target of an oxide film removal step.

For removal of the oxide film 26, for example, a method of removal by a chemical technique such as acid cleaning, a method of removal by a physical technique such as polishing, and the like can be adopted. Among them, the method of removal by a chemical technique is preferable, and the method by acid cleaning is more preferable. In a case of acid cleaning, it is preferable to use a cleaning solution that dissolves an oxide film as a target, and does not erode another component on a substrate.

An acid cleaning step of removing the oxide film 26 can be performed by, for example, degreasing and washing the substrate 10, then dipping the substrate 10 in an acid cleaning solution, and then performing washing, neutralization processing, drying processing, and the like. As the acid cleaning solution, an ammonium peroxodisulfate aqueous solution, an acid solution such as sulfuric acid, and the like can be used. Among them, an ammonium peroxodisulfate aqueous solution is preferable in terms of solubility. As illustrated in FIG. 3(C), when the oxide film 26 is removed, the plating base film formed on the oxide film 26 is also removed simultaneously.

Figure 4A:
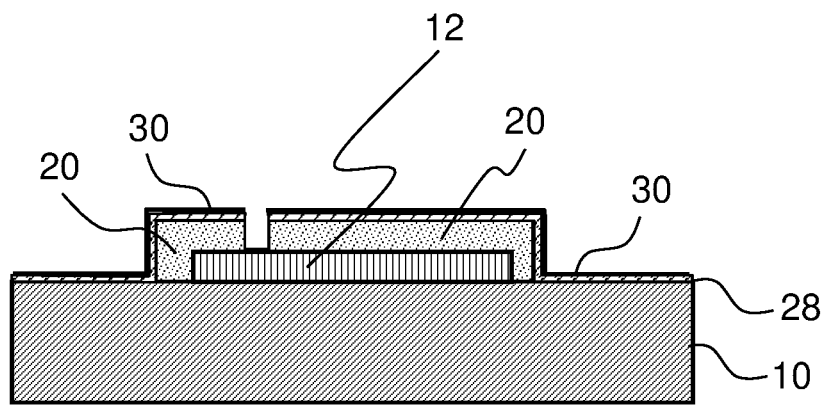
FIGS. 4(A) and 4(B) are schematic diagrams provided for description of the method for manufacturing a bottom-gate transistor according to the present embodiment, and are schematic diagrams illustrating steps of performing electroless plating.
Figure 4B:
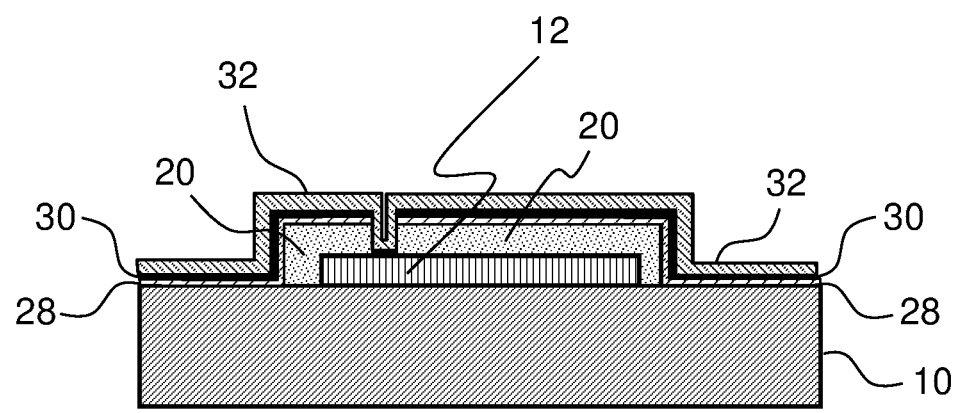

FIGS. 4(A) and 4(B) are schematic diagrams illustrating steps of performing electroless plating.

First, as illustrated in FIG. 4(A), a plating catalyst 30 is provided on the plating base film 28. The plating catalyst 30 is a catalyst used for electroless plating, and, for example, palladium (Pd) and the like can be used. For example, when palladium is used as the plating catalyst 30, a catalytic solution including palladium can be provided as the plating catalyst 30 on the plating base film 28.

Next, as illustrated in FIG. 4(B), an electroless plating film 32 is formed as a first metal layer on the plating catalyst 30. Specific examples of the electroless plating film 32 include electroless nickel plating, electroless copper plating, and the like. When electroless nickel plating is performed, nickel-phosphorus (Ni—P) plating, nickel-boron (Ni—B) plating, other composite plating, and the like can be adopted. For example, by dipping the entire substrate in an electroless plating solution such as nickel-phosphorus, a metal ion can be reduced and deposited on a surface of the plating catalyst 30. As illustrated in FIG. 4(B), after the electroless plating film 32 is formed, heat treatment for drying the remaining electroless plating solution may be performed.

Note that, as described above, due to removal of the oxide film 26, the plating base film formed on the oxide film 26 is also removed simultaneously. Therefore, provision of the plating catalyst 30 is performed in a state where there is no plating base film on an exposed portion of the metal film 12 (for example, a copper film). However, for example, when palladium (Pd) is used as the plating catalyst 30, copper (Cu) in contact has an ionization tendency greater than that of palladium (Pd), and palladium can adhere onto the copper film in an excellent manner, and thus the plating catalyst 30 can be provided onto the exposed metal film 12 even without the plating base film. Therefore, in the subsequent electroless plating step, the electroless plating film 32 can also be formed on the exposed portion of the metal film 12 in an excellent manner. When a material of the metal film 12 has an ionization tendency smaller than that of the plating catalyst, provision of the plating catalyst 30 is difficult unless the plating base film 28 is formed on the exposed portion of the metal film 12. However, with such a material (for example, gold) being used, the oxide film 26 is not formed on the metal film 12 even when heat treatment is performed, and thus the oxide film removal step here is unnecessary. Therefore, when the metal film 12 is formed of a material such as gold, the electroless plating step may be performed without any change after provision of the plating catalyst 30 to the entire surface.

Figure 5A:
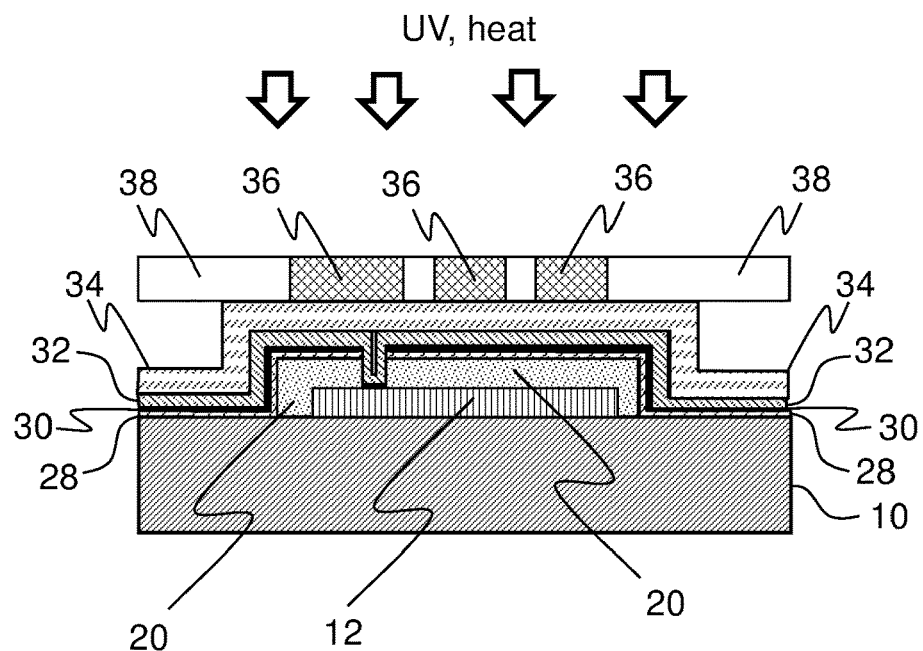
FIGS. 5(A) to 5(C) are schematic diagrams provided for description of the method for manufacturing a bottom-gate transistor according to the present embodiment, and are schematic diagrams illustrating steps of performing photolithography.
Figure 5B:
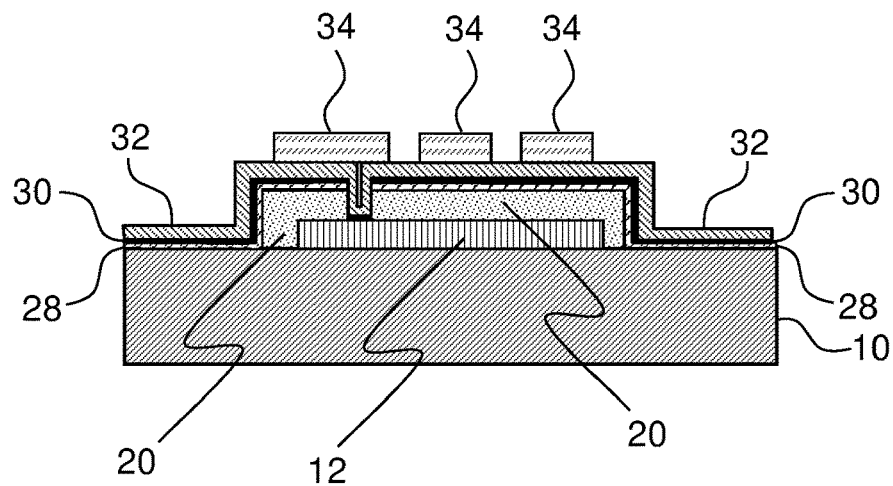
Figure 5C:
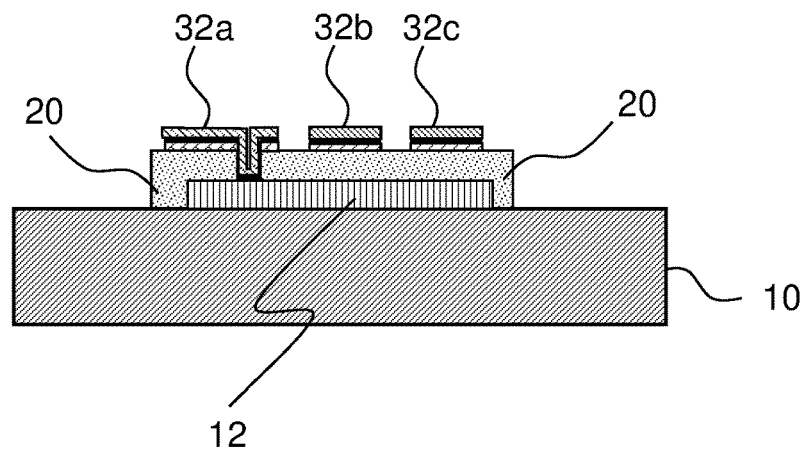

FIGS. 5(A) to 5(C) are schematic diagrams illustrating steps of performing photolithography.

First, as illustrated in FIG. 5(A), a positive resist 34 is formed on the electroless plating film 32, and UV light is radiated to the positive resist 34 via a mask 36 in which an opening 38 is formed corresponding to a predetermined pattern (a mask having the mask 36 corresponding to a region in which the electroless plating film 32 is desired to be formed). As a result, the resist 34 in the region irradiated with UV light (region from which the electroless plating film 32 is desired to be removed) is soluble in a developing solution.

Then, as illustrated in FIG. 5(B), the resist 34 having the predetermined pattern formed according to the mask 36 is formed by dissolving and removing the portion irradiated with UV light by the developing solution.

Next, a portion of the electroless plating film 32 on which the resist 34 is not formed is removed by bringing an etchant into contact with the electroless plating film 32. Then, the remaining resist 34 is irradiated with UV light and brought into contact with the developing solution again, and thus the resist 34 is removed from the substrate. In this way, as illustrated in FIG. 5(C), electroless plating films 32a, 32b, and 32c corresponding to a wiring line that applies a voltage to the gate electrode, a source electrode, and a drain electrode, respectively, can be acquired. Note that, after the resist 34 is removed, heat treatment for drying the remaining developing solution may be performed.

By the steps above, the wiring line that applies a voltage to the gate electrode, the source electrode, and the drain electrode can be formed on the substrate 10. In photolithography, the wiring line, the source electrode, and the drain electrode can also be formed by patterning such as a printing method of a material such as a photo-curable resin and a thermosetting resin.

Figure 6A:
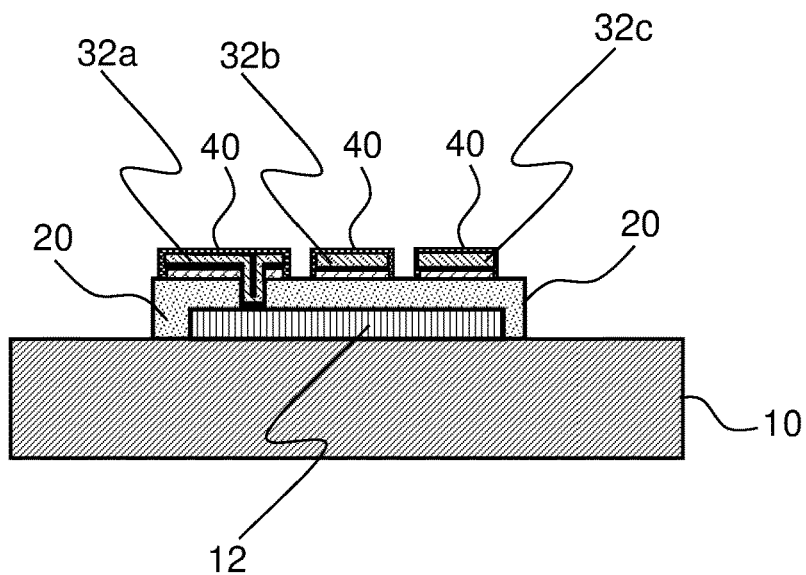
FIGS. 6(A) to 6(C) are schematic diagrams provided for description of the method for manufacturing a bottom-gate transistor according to the present embodiment, and are schematic diagrams illustrating steps of performing electroless gold plating.
Figure 6B:
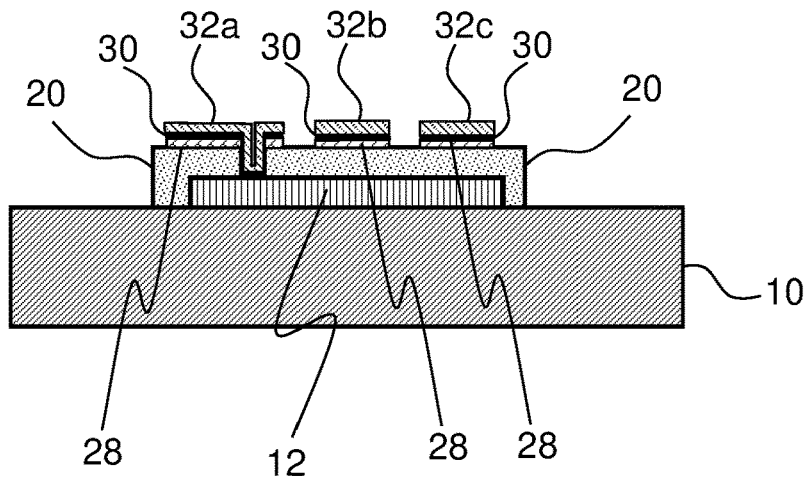
Figure 6C:
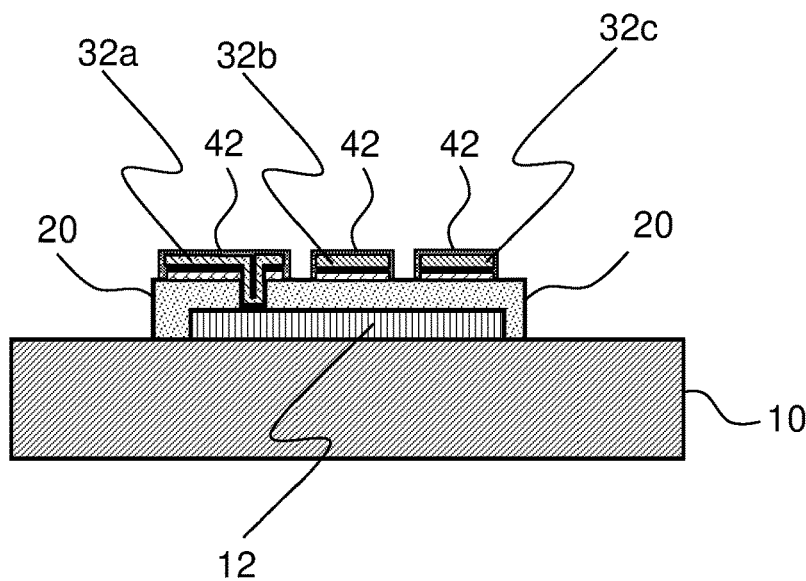

FIGS. 6(A) to 6(C) are schematic diagrams illustrating steps of performing electroless gold plating on the electroless plating films 32a, 32b, and 32c.

As illustrated in FIG. 6(A), an oxide film 40 is formed on each surface of the electroless plating films 32a, 32b, and 32c. After the electroless plating film 32 is formed in FIG. 4(B) described above, the oxide film 40 may be formed when heat treatment for drying the remaining electroless plating solution is performed. After the resist 34 is removed in FIG. 5(C), the oxide film 40 may be formed when heat treatment for drying the remaining developing solution is performed. Since the oxide film 40 becomes a cause of prevention of electroless gold plating, the oxide film 40 is removed as illustrated in FIG. 6(B).

For removal of the oxide film 40, a technique similar to that for the removal of the oxide film 26 described above can be used. In other words, a chemical technique such as acid cleaning and a physical technique such as polishing with a grindstone can be adopted. Among them, a chemical technique is preferable, and acid cleaning is more preferable. In a case of acid cleaning, it is preferable to use a cleaning solution that dissolves an oxide film as a target, and does not erode another component on a substrate.

Similarly to the removal of the oxide film 26 described above, an acid cleaning step of removing the oxide film 40 can be performed by, for example, degreasing, washing, dipping in an acid cleaning solution, and then washing, neutralization processing, drying processing, and the like. As the acid cleaning solution used for the removal of the oxide film 40, an ammonium peroxodisulfate aqueous solution, sulfuric acid, and the like are preferable.

((4) Step)

Next, by dipping the substrate 10 in a substitution gold plating bath, then dipping the substrate 10 in a reduced gold plating bath, the surface of the electroless plating films 32a, 32b, and 32c is coated with an electroless gold plating film 42 as illustrated in FIG. 6(C). In other words, the source electrode is constituted by the electroless plating film 32b and the electroless gold plating film 42 formed on the electroless plating film 32b, and the drain electrode is constituted by the electroless plating film 32c and the electroless gold plating film 42 formed on the electroless plating film 32c.

It is preferable that an energy level difference between a work function of a metal material used for a second metal layer (electroless gold plating film 42) and an energy level of a molecular orbital used for an electron movement in a formation material of a semiconductor layer 44 is smaller than an energy level difference between a work function of a metal material used for a first metal layer (electroless plating film 32) and the energy level of the molecular orbital.

Since a contact resistance (Schottky resistance) occurs between a semiconductor such as an organic semiconductor and a metal wiring line due to a difference between a work function of a metal material constituting an electrode and a level of a highest occupied molecular orbital (HOMO) (or a lowest unoccupied molecular orbital (LUMO)) of the semiconductor, the contact resistance can be suppressed by satisfying the condition described above.

Here, unless otherwise noted, an "energy level of a molecular orbital used for an electron movement in a formation material of a semiconductor layer" in the present specification refers to an energy level of HOMO when the semiconductor layer is a p-type semiconductor, and refers to an energy level of LUMO when the semiconductor layer is an n-type semiconductor.

Suitable examples from the viewpoint described above include use of a source electrode and a drain electrode having a surface coated with gold when, for example, an organic semiconductor layer having a high HOMO level such as pentacene is formed on the surface of the source electrode and the drain electrode. Here, a case where gold is used for coating is illustrated as an example, but a metal material having a work function suitable for HOMO/LUMO levels of an organic semiconductor material may be used for coating.

By the steps above, the source electrode and the drain electrode are formed. The method can remove an oxide film on a metal that may be formed in a heat treatment step during manufacturing of a transistor, and thus electroless plating can be performed on the metal in an excellent manner.

Note that, in the aspect described above, the electroless gold plating film 42 is also formed on the electroless plating film 32a (the wiring line that applies a voltage to the gate electrode) in terms of the step, but the electroless gold plating film 42 is configured to be provided for reducing a contact resistance between the source/drain electrodes and the semiconductor layer, and may not necessarily be provided on the electroless plating film 32a.

FIGS. 7(A), 7(B), 8(A), and 8(B) are schematic diagrams illustrating steps of performing patterning of the semiconductor layer.

(Formation of Semiconductor Layer 44)

Figure 7A:
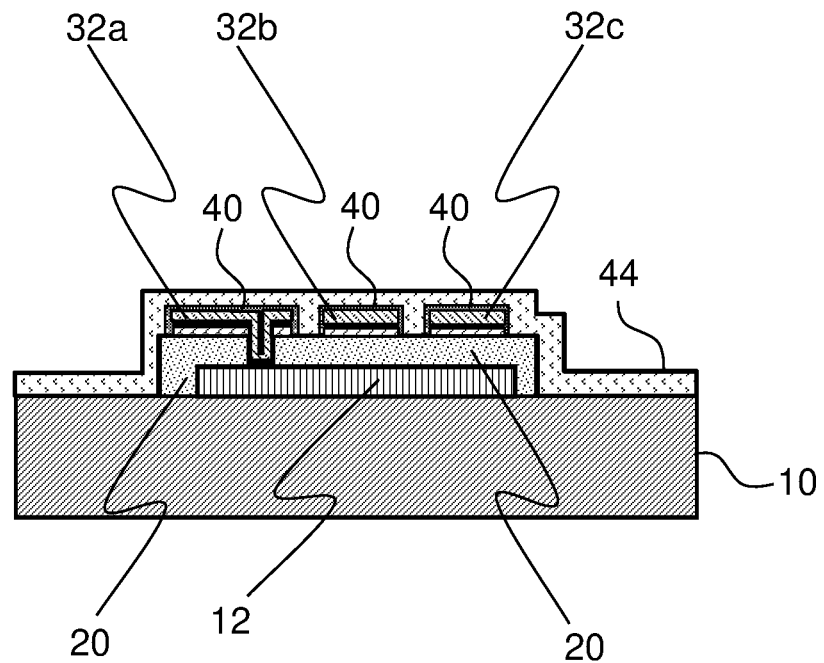
FIGS. 7(A) and 7(B) are schematic diagrams provided for description of the method for manufacturing a bottom-gate transistor according to the present embodiment, and are schematic diagrams illustrating steps of performing patterning of a semiconductor layer.

First, as illustrated in FIG. 7(A), the semiconductor layer 44 is formed on the substrate 10 on which the metal film 12 (gate electrode), the insulator layer 20, and the electroless plating film 32 (source/drain electrodes) are formed.

The semiconductor layer 44 may be an organic semiconductor, and may be an inorganic semiconductor. When the semiconductor layer 44 is an organic semiconductor, for example, copper phthalocyanine (CuPc), pentacene, rubrene, tetracene, soluble pentacene such as 6,13-bis (triisopropylsilylethynyl) pentacene (TIPS pentacene), an organic semiconductor polymer such as poly (3-hexylthiophene-2,5-diyl) (P3HT), fullerenes such as $C_{60}$, and the like can be used as a material.

Among them, soluble pentacene such as TIPS pentacene and an organic semiconductor polymer such as P3HT are preferable from a viewpoint of being soluble in an organic solvent such as toluene and capable of forming an organic semiconductor layer in a wet step. After an organic semiconductor solution acquired by dissolving the material of the organic semiconductor in an organic solvent (such as toluene) is applied onto the substrate 10, the solvent is heated and evaporated (volatilized), and thus the organic semiconductor layer can be easily formed. For formation of the organic semiconductor layer, a wet method, a sublimation method, a transfer method, and the like can be adopted.

Hereinafter, an aspect where an organic semiconductor is used as the semiconductor layer 44 will be described.

(Formation of Photosensitive Water-Soluble Resin Layer 46)

Next, a photosensitive water-soluble resin layer 46 is formed on the semiconductor layer 44. Here, an example of a formation step of the photosensitive water-soluble resin layer 46 will be described. First, a first protective layer solution (first solution) including a first resin, a photopolymerization initiator (first photopolymerization initiator) that cures the first resin with UV light, and a first solvent that dissolves the first resin and the photopolymerization initiator is applied, and the photosensitive water-soluble resin layer 46 is formed on a surface of the semiconductor layer 44.

In a case where the semiconductor layer 44 is an organic semiconductor layer, the organic semiconductor layer may also be affected by an organic solvent when the organic solvent is used in pattern formation of the semiconductor layer 44. The reason is that an organic semiconductor polymer and the like constituting the organic semiconductor layer are soluble in the organic solvent and the like. From such a viewpoint, it is preferable to use the photosensitive water-soluble resin layer 46 described above in pattern formation. Since the photosensitive water-soluble resin layer 46 is water-soluble, pattern removal after light irradiation can be performed by using a water-soluble solvent (for example, see the first solvent described above) instead of the organic solvent. Thus, the organic semiconductor layer can be prevented from being affected, and precise pattern formation can be achieved. From a similar viewpoint, a photosensitive resin having solubility to a fluorine-based solvent can also be used. Therefore, for example, a resin (water-soluble resin, fluorine-based solvent soluble resin) having solubility to water or a fluorine-based solvent can be used as the first resin, and, for example, water, a fluorine-based solvent, and the like can be used as the first solvent.

A water contact angle of the photosensitive water-soluble resin layer 46 when a water-soluble resin is used as the first resin and water is used as the first solvent is, for example, 62 degrees. Note that, when the first resin or the first solvent has a property of the photopolymerization initiator, a solution for forming the photosensitive water-soluble resin layer 46 may not include the photopolymerization initiator.

Figure 7B:
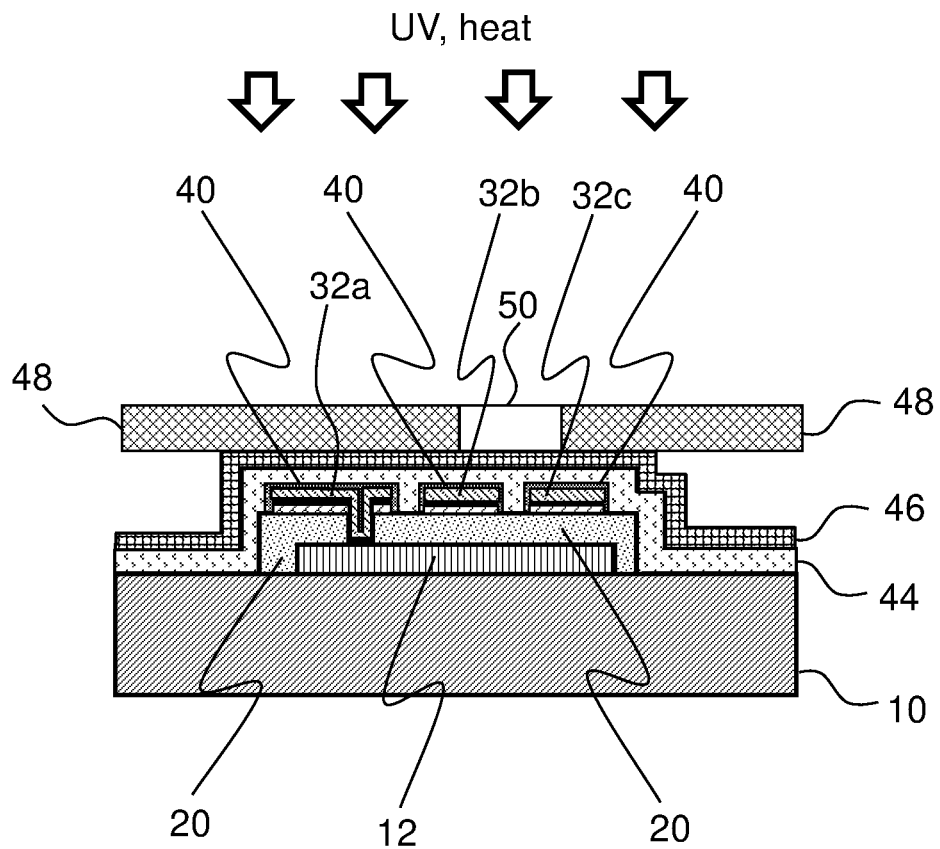

Then, as illustrated in FIG. 7(B), the photosensitive water-soluble resin layer 46 is irradiated with UV light via a mask 48 in which an opening 50 is formed corresponding to a predetermined pattern. As a result, the photosensitive water-soluble resin layer 46 in the region irradiated with UV light (region in which the semiconductor layer 44 is desired to remain) is cured. The photosensitive water-soluble resin layer 46 can be selectively cured by using the mask described above, but the photosensitive water-soluble resin layer may be cured by direct selective irradiation with UV light by a direct drawing exposure device.

Figure 8A:
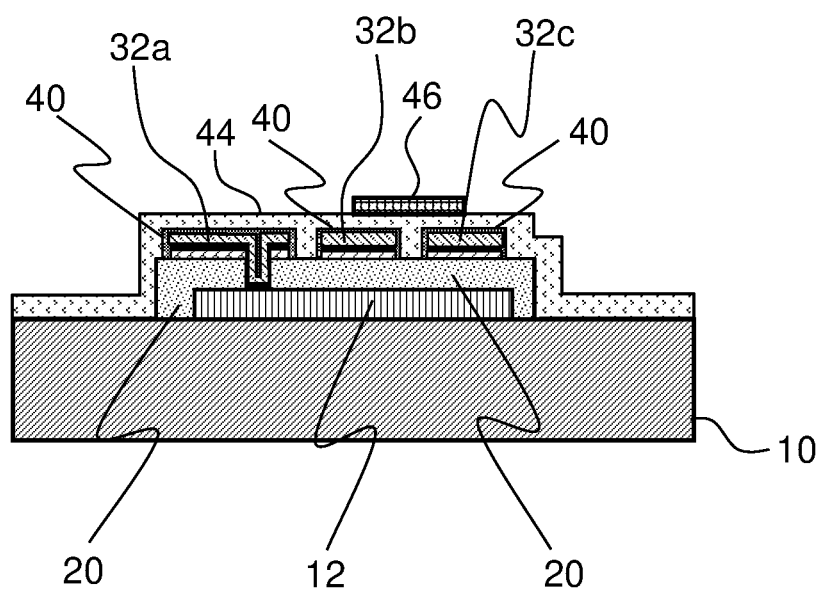
FIGS. 8(A) and 8(B) are schematic diagrams provided for description of the method for manufacturing a bottom-gate transistor according to the present embodiment, and are schematic diagrams illustrating steps of performing patterning of a semiconductor layer.

Next, as illustrated in FIG. 8(A), the photosensitive water-soluble resin layer 46 having a predetermined pattern is formed by dissolving and removing, by the first solvent (such as water and a fluorine-based solvent), a portion without irradiation with UV light. In other words, the portion of the photosensitive water-soluble resin layer 46 cured by irradiation with UV light remains. The region in which the photosensitive water-soluble resin layer 46 remains includes a region between the source electrode and the drain electrode.

As a material constituting the photosensitive water-soluble resin layer 46, for example, a material acquired by diluting "BIOSURFINE (registered trademark)-AWP-MRH" manufactured by Toyo Gosei Co., Ltd. with water to 3 wt %.

(Patterning Formation of Semiconductor Layer 44)

Figure 8B:
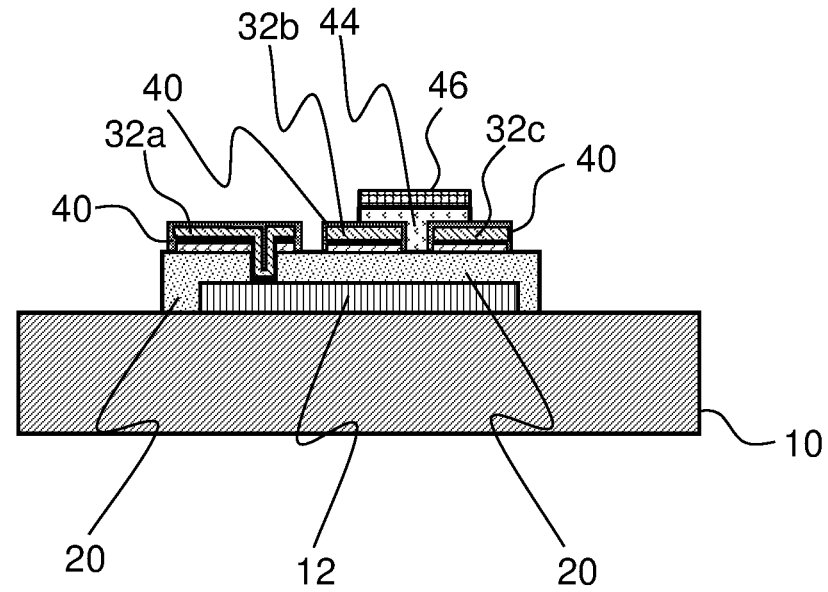

Next, the substrate 10 on which the photosensitive water-soluble resin layer 46 having the predetermined pattern is formed is dipped in an organic solvent (for example, toluene and the like when TIPS pentacene is used as a material of the organic semiconductor layer) that can dissolve the semiconductor layer 44, and thus, as illustrated in FIG. 8(B), a portion of the semiconductor layer 44 that is not covered with the photosensitive water-soluble resin layer 46, i.e., an exposed portion of the semiconductor layer 44 is dissolved and removed with the photosensitive water-soluble resin layer 46 as a mask. In this way, the semiconductor layer 44 is in a state of being formed between the source electrode and the drain electrode, and the semiconductor layer 44 as a target can be acquired.

The remaining photosensitive water-soluble resin layer 46 functions as a passivation layer of the transistor. Although not illustrated, a protective layer may be further provided so as to cover the semiconductor layer 44 and the photosensitive water-soluble resin layer 46 as necessary in order to improve a function of passivation. Note that, by collecting an organic semiconductor component by solvent removal from the organic solvent that dissolves the exposed portion of the semiconductor layer 44, the organic semiconductor component may be reused as a material of the organic semiconductor.

Note that a method for patterning the semiconductor layer 44 by using the photosensitive water-soluble resin layer 46 is described here, but the method for patterning the semiconductor layer 44 is not limited thereto, and a known method may be used. For example, as illustrated in FIG. 6(C), after the source electrode and the drain electrode are formed, a resist layer may be provided. Then, by the photolithography step, by forming, in the resist layer, an opening corresponding to a portion in which the semiconductor layer is desired to be formed, forming the semiconductor layer in the opening, and removing the resist layer, the semiconductor layer formed in a desired pattern may be acquired.

In the manufacturing method according to the present embodiment, as described above, the step (oxide film removal step) of removing the oxide films 26 and 40 is performed, and thus occurrence of a malfunction in a component formation and the plating step performed on the substrate 10 can be suppressed. From this viewpoint, the manufacturing method according to the present embodiment can be suitably applied to a method for manufacturing a transistor by a subtractive process. The reason is that the subtractive process achieves a desired metal wiring line by removing an unnecessary region from a metal film formed on a substrate by photolithography, and includes many steps of dipping an object to be processed in a developing solution, an etchant, and the like. After the object to be processed is dipped in the solution, heat treatment for drying the remaining solution is performed, and an oxide film may be formed on a metal due to the heat treatment at this time. However, the manufacturing method according to the present embodiment can remove the oxide film by the oxide film removal step, and thus plating can continue to be performed in an excellent manner even on the metal patterned by the subtractive process.

An example of manufacturing a bottom-gate bottom-contact transistor, which is used as an example of the bottom-gate transistor, is mainly described above. However, according to the present embodiment, it is needless to say that a bottom-gate top-contact transistor can also be manufactured according to the technique described above.

<Top-Gate Transistor>

A method for manufacturing a top-gate transistor according to the present embodiment includes (1) a step of forming a first metal layer on a substrate or on a semiconductor layer provided on a substrate, (2) a step of applying a resist onto the first metal layer, and patterning the first metal layer by a photolithographic method, (3) an oxide film removal step of removing an oxide film formed on the patterned first metal layer, and (4) a step of forming a source electrode (S electrode) and a drain electrode (D electrode) by forming a second metal layer on the first metal layer after the oxide film removal step.

Hereinafter, for (1) step, a case where an electroless plating film 56 is formed as a first metal layer on a substrate (a case where a top-gate bottom-contact transistor is manufactured) will be described as an example. However, a case where a first metal layer is formed on a semiconductor layer provided on a substrate (a case where a top-gate top-contact transistor is manufactured) can also be implemented according to a method indicated below. Note that description of a content overlapping the content described in the first embodiment will be omitted, and it is needless to say that the content of the first embodiment can be appropriately adopted unless otherwise noted.

FIGS. 9 to 13 are schematic diagrams provided for description of a method for manufacturing a top-gate transistor according to the present embodiment.

Figure 9A:
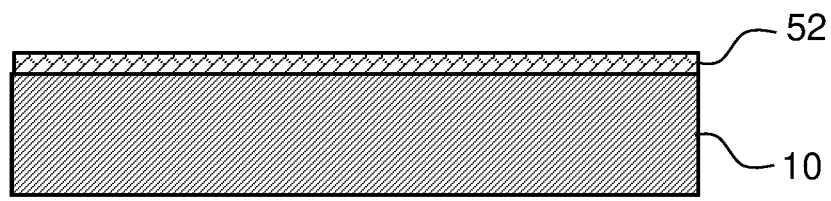
FIGS. 9(A) to 9(C) are schematic diagrams provided for description of a method for manufacturing a top-gate transistor according to the present embodiment, and are schematic diagrams illustrating steps of performing electroless plating.
Figure 9B:
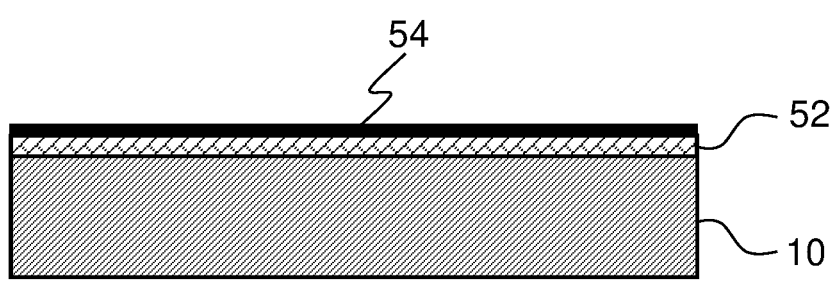
Figure 9C:
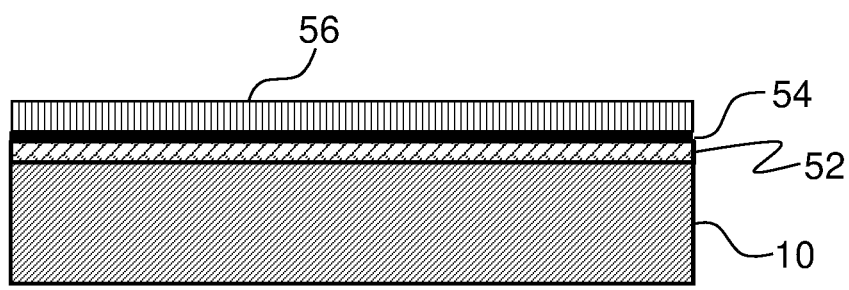

FIGS. 9(A) to 9(C) are schematic diagrams illustrating steps of performing electroless plating.

((1) Step)

First, as illustrated in FIG. 9(A), a plating base film 52 is formed on a substrate 10. The plating base film 52 facilitates electroless plating, and a plating base film similar to the plating base film 28 described above can be used. For example, the plating base film 52 can be formed by applying an amine solution and the like acquired by adding a solvent to a silane coupling agent.

Then, as illustrated in FIG. 9(B), a plating catalyst 54 is formed on the plating base film 52. The plating catalyst 54 is used for electroless plating, and a plating catalyst similar to the plating catalyst 30 described above can be used. For example, palladium and the like can be used.

Next, as illustrated in FIG. 9(C), an electroless plating film 56 is formed as a first metal layer on the plating catalyst 54. The electroless plating film 56 can be formed by electroless plating, and an electroless plating film similar to the electroless plating film 32 described above can be used. For example, by dipping the entire substrate in an electroless plating solution such as nickel-phosphorus, a metal ion can be reduced and deposited on a surface of the plating catalyst 54. The deposited metal is patterned to be source/drain electrodes (SD electrodes).

FIGS. 10(A) to 10(C) and 11(A) to 11(C) are schematic diagrams illustrating steps of forming a source electrode and a drain electrode by a step of performing photolithography, and further forming a semiconductor layer.

((2) Step)

Figure 10A:
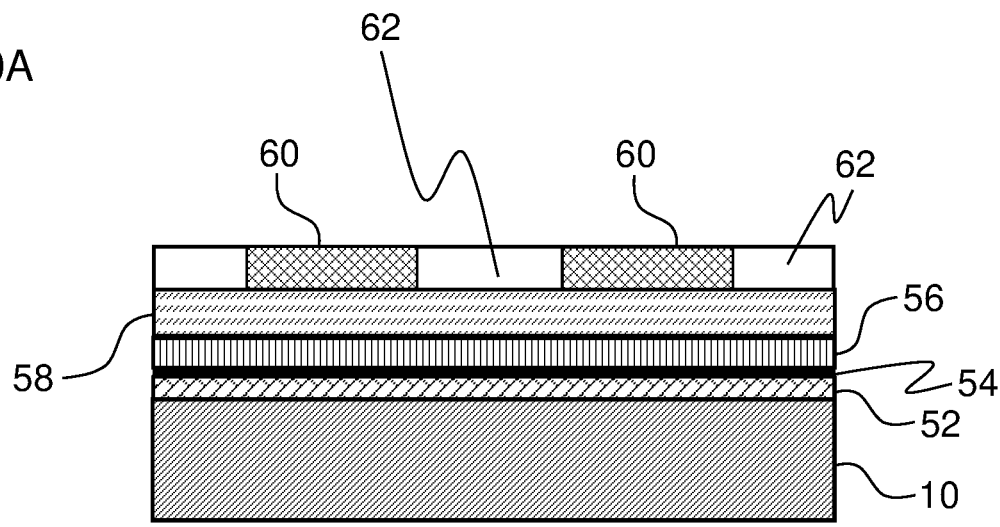
FIGS. 10(A) to 10(C) are schematic diagrams provided for description of the method for manufacturing a top-gate transistor according to the present embodiment, and are schematic diagrams illustrating steps of performing photolithography.

First, as illustrated in FIG. 10(A), a positive resist 58 is formed on the electroless plating film 56, and UV light is radiated to the positive resist 58 via a mask 60 in which the opening 62 is formed corresponding to a predetermined pattern (a mask having an opening 62 corresponding to a region in which the electroless plating film 56 is desired to be formed). As a result, the resist 58 in the region irradiated with UV light (region from which the electroless plating film 56 is desired to be removed) is soluble in a developing solution.

Figure 10B:
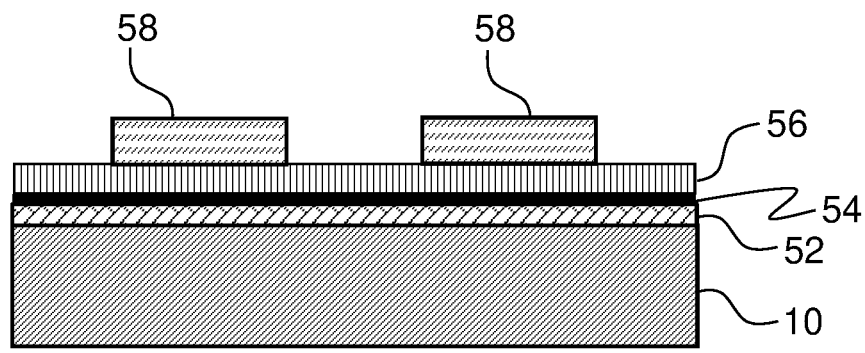

Then, as illustrated in FIG. 10(B), a portion (exposed portion) of the resist 58 irradiated with UV light is dissolved and removed by dipping the resist 58 in the developing solution (for example, tetramethyl ammonium hydroxide (TMAH) and the like).

Subsequently, a portion of the electroless plating film 56 on which the resist 58 is not formed is removed by bringing an etchant into contact with the electroless plating film 56. Then, the remaining resist 58 is irradiated with UV light and brought into contact with the developing solution again, and thus the resist 58 is removed from the substrate.

In this way, electroless plating films 56a and 56b formed in a predetermined pattern corresponding to the source electrode and the drain electrode are acquired. Note that, after the resist 58 is removed, a drying step for removing the remaining developing solution may be performed. The drying step may be drying by heat treatment, or may be natural drying.

In photolithography, the source electrode and the drain electrode can also be formed by patterning such as a printing method of a material such as a photo-curable resin and a thermosetting resin.

((3) Step)

Figure 10C:
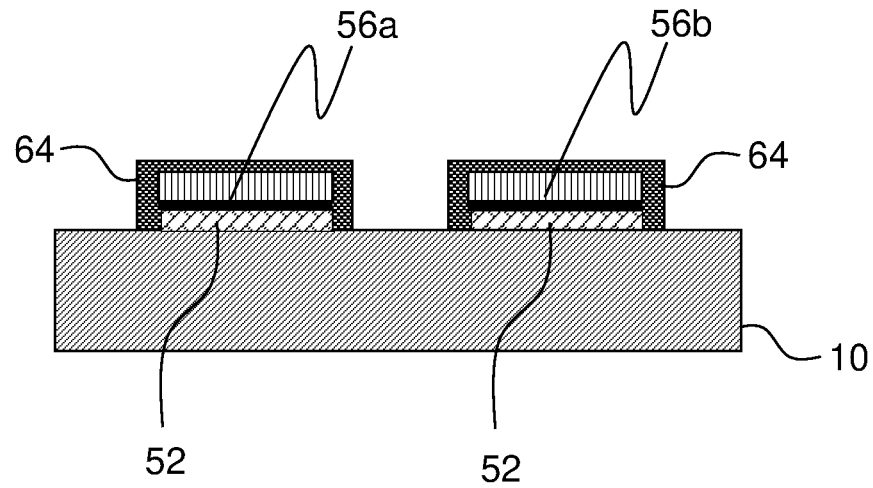

Then, when heat treatment for removing the remaining developing solution is performed, an oxide film 64 is formed on a surface of the electroless plating films 56a and 56b as illustrated in FIG. 10(C). Thus, the oxide film 64 is removed by a technique similar to that for removal of the oxide film 40 (see FIG. 11(A)).

((4) Step)

Figure 11A:
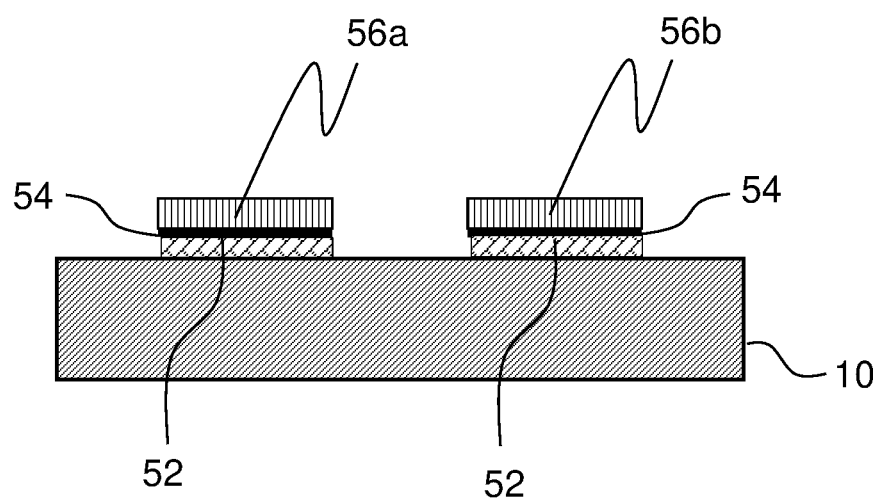
FIGS. 11(A) to 11(C) are schematic diagrams provided for description of the method for manufacturing a top-gate transistor according to the present embodiment, and are schematic diagrams illustrating steps of forming a semiconductor layer on a substrate.
Figure 11B:
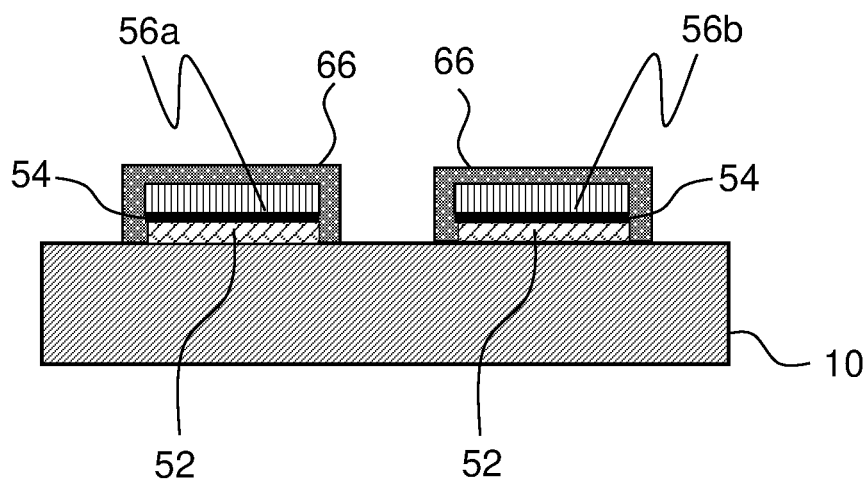

Next, by dipping the substrate 10 in a substitution gold plating bath, then dipping the substrate 10 in a reduced gold plating bath, the surface of the electroless plating films 56a and 56b is coated with an electroless gold plating film 66 as illustrated in FIG. 11(B). In this way, the source electrode constituted by the electroless plating film 56a and the electroless gold plating film 66 formed on the electroless plating film 56a, and the drain electrode constituted by the electroless plating film 56b and the electroless gold plating film 66 formed on the electroless plating film 56b can be acquired.

It is preferable that an energy level difference between a work function of a metal material used for a second metal layer (electroless gold plating film 66) and an energy level of a molecular orbital used for an electron movement in a formation material of a semiconductor layer 68 described later is smaller than an energy level difference between a work function of a metal material used for a first metal layer (electroless plating film 56) and the energy level of the molecular orbital.

Since a contact resistance (Schottky resistance) occurs between a semiconductor such as an organic semiconductor and a metal wiring line due to a difference between a work function of a metal material constituting an electrode and a level of a highest occupied molecular orbital (HOMO) (or a lowest unoccupied molecular orbital (LUMO)) of the semiconductor, the contact resistance can be suppressed by satisfying the condition described above.

It is desirable to use a source electrode and a drain electrode having a surface coated with gold when an organic semiconductor layer having a high HOMO level such as pentacene is formed on the surface of the source electrode and the drain electrode. Note that gold is used for coating in the present embodiment, but it is preferable to use, for coating, a metal material having a work function suitable for HOMO/LUMO levels of an organic semiconductor material.

By the steps above, the source electrode and the drain electrode are formed. The method can remove an oxide film on a metal that may be formed in a heat treatment step during manufacturing of a transistor, and thus electroless plating can be performed on the metal in an excellent manner.

(Formation of Semiconductor Layer 68)

Figure 11C:
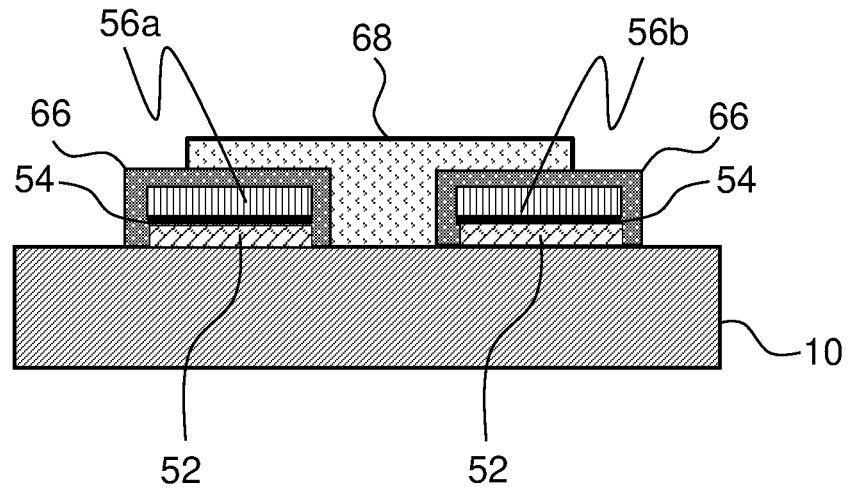

Next, as illustrated in FIG. 11(C), the semiconductor layer 68 is formed. In other words, the semiconductor layer 68 is formed on the substrate 10 on which the electroless plating films 56a and 56b (source/drain electrodes) are formed.

A semiconductor layer similar to the semiconductor layer 44 described above can be adopted for the semiconductor layer 68. For example, with the semiconductor layer 68 as an organic semiconductor layer, soluble pentacene represented by TIPS pentacene (6,13-bis (triisopropylsilylethynyl) pentacene), and an organic semiconductor such as an organic semiconductor polymer such as P3HT (poly (3-hexylthiophene-2,5-diyl)) can be used. Since they are soluble in an organic solvent such as toluene, after an organic semiconductor solution acquired by dissolving the organic semiconductor in the organic solvent is applied onto the substrate 10, the solvent is heated and evaporated (volatilized), and thus the organic semiconductor layer can be easily formed. The semiconductor layer 68 can be formed by a method similar to that for the semiconductor layer 44 described above.

Figure 12A:
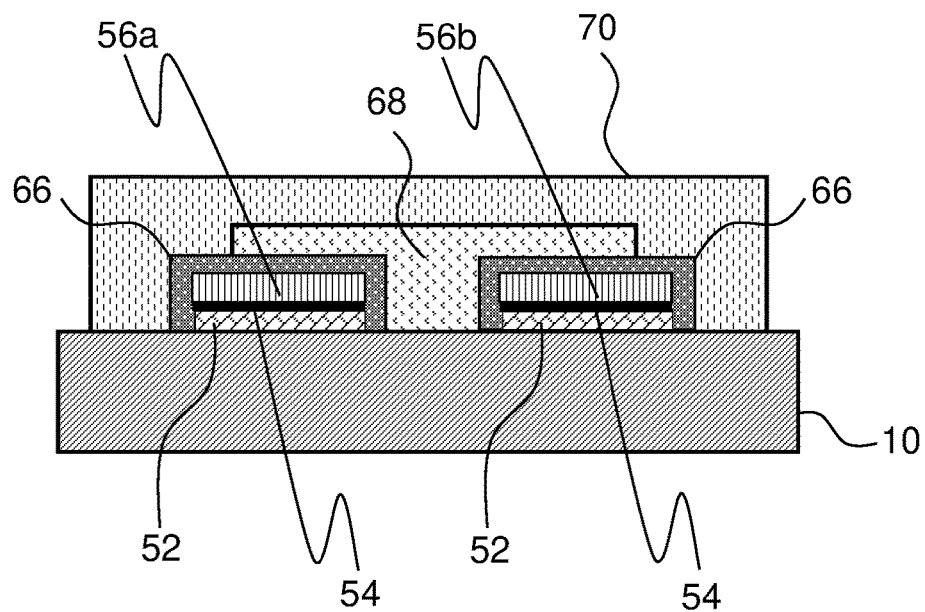
FIGS. 12(A) and 12(B) are schematic diagrams provided for description of the method for manufacturing a top-gate transistor according to the present embodiment, and are schematic diagrams illustrating steps of performing photolithography.
Figure 12B:
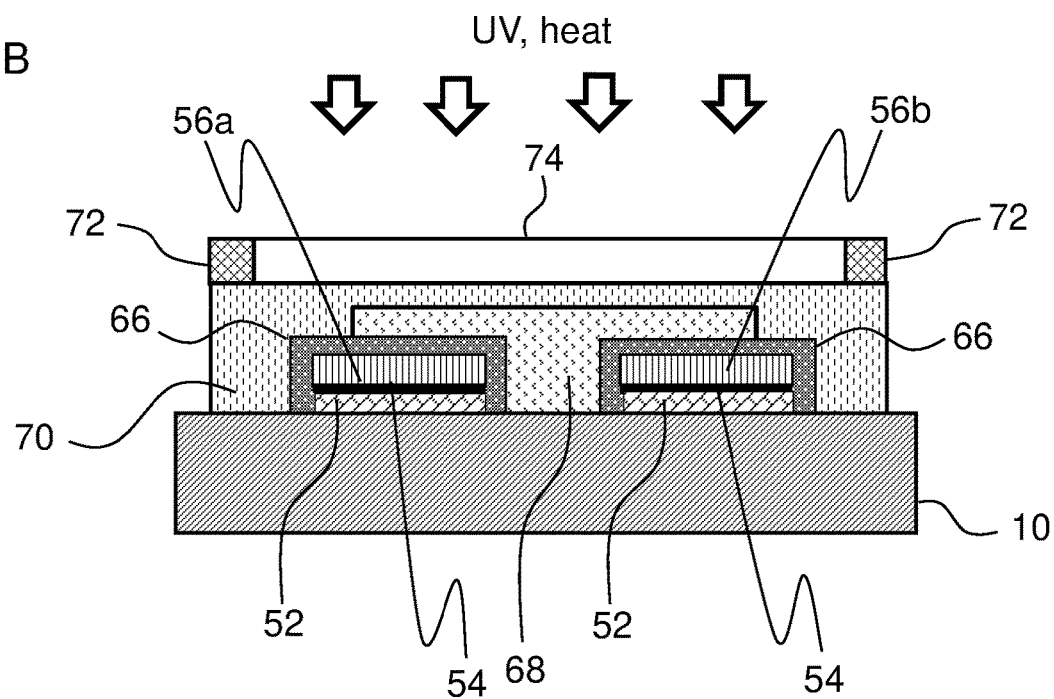

FIGS. 12(A) to 12(B) are schematic diagrams illustrating steps of performing photolithography.

(Formation of Insulator Layer 70)

First, as illustrated in FIG. 12(A), an insulator layer 70 is formed on the substrate 10. An insulator layer similar to the insulator layer 20 described above can be adopted for the insulator layer 70. For example, as a photo-curable resin having an insulating property, a UV photo-curable acrylic resin, a UV photo-curable epoxy resin, a UV photo-curable enethiol resin, a UV photo-curable silicone resin, and the like can be used.

Subsequently, as illustrated in FIG. 12(B), the insulator layer 70 is irradiated with UV light via a mask 72 in which the opening 74 is formed corresponding to a predetermined pattern on the insulator layer 70 (a mask having an opening 74 corresponding to a region in which the insulator layer 70 is desired to be formed). As a result, the insulator layer 70 in a region irradiated with UV light (the region in which the insulator layer 70 is desired to be formed) is cured. In this way, the insulator layer 70 can be selectively cured by using the mask, but the insulator layer 70 may be cured by direct selective irradiation with UV light by a direct drawing exposure device. Note that, at this time, it is more suitable to apply heat treatment for facilitating a chemical reaction in the region irradiated with UV light.

Figure 13A:
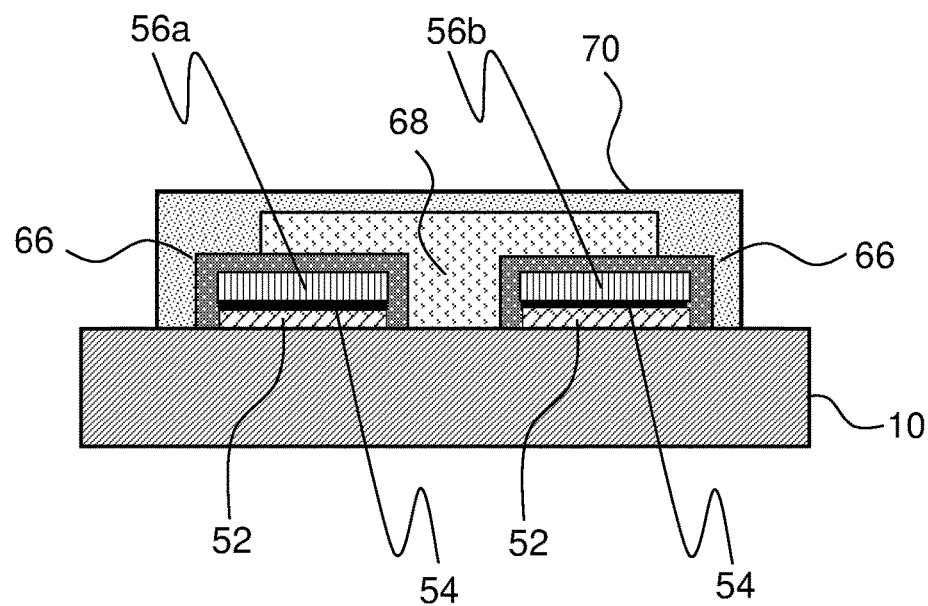
FIGS. 13(A) and 13(B) are schematic diagrams provided for description of the method for manufacturing a top-gate transistor according to the present embodiment, and are schematic diagrams illustrating steps of forming a metal film on the substrate.
Figure 13B:
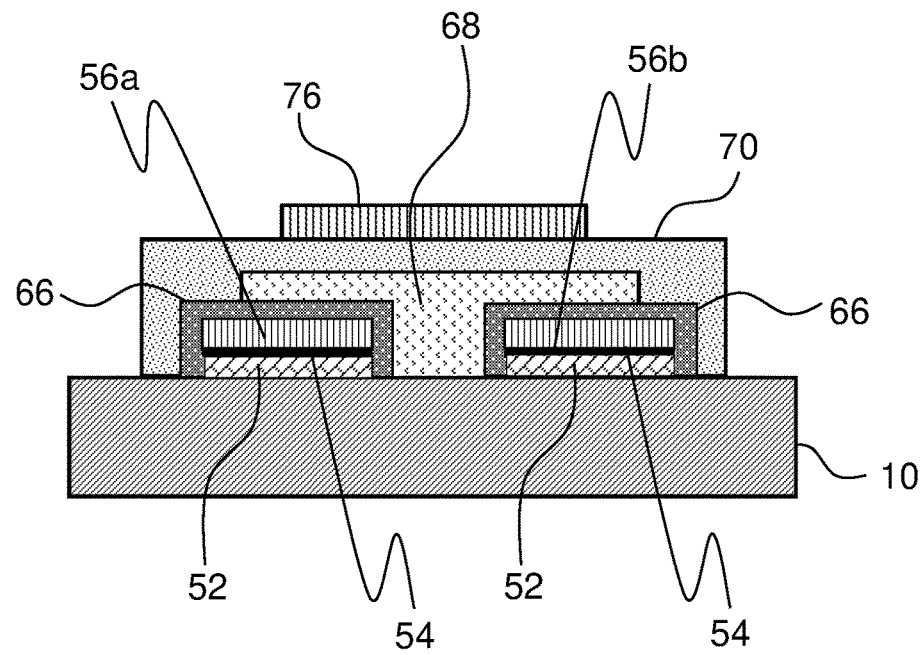

FIGS. 13(A) to 13(B) are schematic diagrams illustrating steps of forming a metal film on the substrate.

As illustrated in FIG. 13(A), the insulator layer 70 having the pattern corresponding to the opening 74 is formed by dissolving and removing, by the developing solution, a portion of the insulator layer 70 without irradiation with UV light. In other words, the portion of the insulator layer 70 cured by irradiation with UV light remains.

By the steps above, the insulator layer 70 can be formed on the electroless plating film 56 to be the source/drain electrodes. Note that a thickness of the insulator layer 70 is preferably a few 100 nanometers from a viewpoint of suppressing a leak between a gate electrode and source/drain electrodes. A thickness of the insulator layer 70 can be controlled by concentration and an application condition of resin. The insulator layer 70 can also be formed by patterning such as a printing method of a material such as a photo-curable resin and a thermosetting resin. Thus, a material that has an insulating property and can be applied is applicable.

(Formation of Metal Film 76)

Then, as illustrated in FIG. 13(B), a metal film 76 is formed on the insulator layer 70. The metal film 76 constitutes a gate electrode, and a metal film similar to the metal film 12 described above can be adopted. For example, a copper film can be formed on the insulator layer 70 by depositing copper as the metal film 76.

Furthermore, although not illustrated, the metal film 76 can be formed in a predetermined pattern according to the gate electrode as necessary by photolithography similar to that in the first embodiment. Furthermore, a protective layer may be provided.

As a specific example in photolithography, for example, a positive resist is formed on the metal film 76. The resist can be formed by applying a photoresist material onto the metal film 76 and pre-baking the photoresist material. Next, a mask in which an opening is formed corresponding to a predetermined pattern is disposed on the resist. Then, the resist is exposed by irradiation with ultraviolet light (UV light) via the mask. Note that, at this time, it is more suitable to apply heat treatment for facilitating a chemical reaction in a region irradiated with UV light.

Subsequently, a portion (exposed portion) of the resist irradiated with UV light is dissolved and removed by dipping the resist in a developing solution (for example, TMAH and the like). In this way, the metal film 76 can be formed in the predetermined pattern according to the gate electrode.

An example of manufacturing a top-gate bottom-contact transistor, which is used as an example of the top-gate transistor, is described above. However, according to the present embodiment, it is needless to say that a top-gate top-contact transistor can also be manufactured according to the technique described above.

EXAMPLES

Next, description is made on examples in the present invention and comparative examples. The present invention is not limited to the examples. A bottom-gate organic transistor (see FIGS. 1 to 8) was produced based on the following technique, and a characteristic thereof was evaluated.

<Production of Organic Transistor by Subtractive Process>
(Formation of Gate Electrode)

A polyethylene terephthalate (PET; "Cosmoshine A4100" (smooth surface) manufactured by TOYOBO CO., LTD.) was used for a substrate. After Cu having a thickness of 150 nm was deposited on an entire surface of the substrate, heat treatment was performed at 105° C. for 30 minutes. Then, after a "Sumiresist (PFI-34A6)" solution was applied to the entire surface of the substrate by dip coating, pre-bake was performed at 105° C. for five minutes.

Next, after a 320 mJ/cm² substrate was irradiated with an i line via a photomask, post exposure bake (PEB) was performed at 105° C. for five minutes. Subsequently, the substrate was dipped in a 2.38% TMAH aqueous solution for 60 seconds to develop a resist. After washing, the substrate was dipped in an etchant for 60 seconds, and patterning of a Cu film was performed. A 10 wt % ammonium peroxodisulfate aqueous solution was used for the etchant. Next, after the entire surface of the substrate was irradiated with the i line at irradiation intensity of 320 mJ/cm², the substrate was dipped in an ethanol and acetone solvent, and ultrasonic processing is performed to perform resist peeling.

Then, after the substrate was dipped in 2-propanol and the ultrasonic processing was performed, heat treatment was performed at 120° C. for 10 minutes, and thus a Cu film wiring line (gate electrode (G electrode)) was formed on the substrate.

(Formation of Insulator Layer)

Next, an insulator layer was formed. Ultraviolet irradiation and ozone processing (UV/O₃ processing) were performed on the substrate including the G electrode for 2.4 minutes, and the surface of the substrate was washed. Then, an epoxy resin-based photoresist solution was prepared as a precursor solution of the insulator layer. Specifically, an epoxy resin-based photoresist solution was prepared by diluting "SU-8 3005" (manufactured by Nippon Kayaku Co., Ltd.) with cyclohexanone such that a solid content of "SU-8" (manufactured by Nippon Kayaku Co., Ltd.) is 15 wt %, and adding "Surflon 651" (manufactured by AGC Seimi Chemical Co., Ltd.) to the solid content of "SU-8" by 0.05 wt %. The precursor solution was applied onto the substrate by dip coating (pulling speed 1 mm/s). After application, pre-bake was performed at 120° C. for 10 minutes.

Subsequently, the i line was radiated at irradiation intensity of 240 mJ/cm² via a mask. After exposure, heat treatment was performed at 120° C. for an hour, the substrate was then dipped in a propylene glycol 1-monomethyl ether 2-acetate (PGMEA) solution, and development of the coated film was performed. After washing, heat treatment was performed at 120° C. for three hours, and the insulator layer (gate insulating layer) was formed on the substrate.

(Formation of Source/Drain Electrodes)

Furthermore, the source/drain electrodes (SD electrodes) and a wiring line that applies a voltage to the gate electrode were formed. First, UV/O₃ processing was performed for three minutes on the substrate on which the gate insulating layer was formed, and the surface of the substrate was activated. Next, a 0.5 wt %3-(2-aminoethylamino) propyltrimethoxysilane methyl isobutyl ketone solution was applied onto the substrate by dip coating (pulling speed 1.2 mm/s).

Subsequently, after heat treatment was performed at 120° C. for 15 minutes, the substrate was dipped in a 2.5 wt % ammonium peroxodisulfate aqueous solution, and thus an exposed oxide film on the surface of Cu was removed. After washing, the substrate was dipped in a Pd aqueous solution ("Melplate Activator 7331"; manufactured by Meltex Inc.) for a minute, the substrate was then dipped in an electroless Ni plating bath ("NI-867"; manufactured by Meltex Inc.) at 74° C. for a minute, and an electroless Ni plating film was formed on the entire surface of the substrate. After washing and drying (120° C. for 10 minutes) were performed, "Sumiresist" was applied onto the substrate by dip coating (pulling speed 1 mm/s). Then, after formation of a resist layer, the i line was radiated at irradiation intensity of 200 mJ/cm² via a mask.

Next, the substrate was dipped in the 2.38% TMAH aqueous solution for 60 seconds, and the resist was developed. After washing, the substrate was dipped in an etchant at 60° C. for 15 seconds, and patterning of the electroless Ni plating film was performed. For the etchant of the electroless Ni plating film, a phosphoric acid, a nitric acid, an acetic acid, and water were mixed at a mass ratio of 10:1:1:2, were used. After washing, the entire surface was irradiated with the i line, the substrate was then dipped in ethanol and acetone in order, and resist peeling was performed. After washing, heat treatment was performed at 120° C. for 10 minutes. Subsequently, in order to remove the oxide film formed on an electroless Ni plating surface, the substrate was dipped in the 2.5 wt % ammonium peroxodisulfate aqueous solution for 10 seconds. Then, the substrate was dipped in a substitution Au plating bath ("Supermex #255" manufactured by N.E. CHEMCAT Corporation) at 72° C. for five minutes, the substrate was dipped in a reduced Au plating bath ("Supermex #880" manufactured by N.E. CHEMCAT Corporation) at 60° C. for two minutes, and the electroless Ni plating surface was coated with Au.

After Au plating, the substrate was washed and dipped in 2-propanol, and ultrasonic was performed. Then, heat treatment was performed at 120° C. for 90 minutes, and the wiring lines that apply a voltage to the SD electrodes and the G electrode were formed.

(Formation of Organic Semiconductor Layer)

Lastly, an organic semiconductor layer was formed on the substrate. First, UV/$O_3$ processing was performed for four minutes on the substrate including the SD electrodes, and the surface of the substrate was activated. Next, a 0.5 wt % trimethoxyphenylsilane toluene solution was applied onto the substrate by dip coating (pulling speed 1 mm/s). After application, heat treatment was performed at 105° C. for 10 minutes, the substrate was then dipped in a 1 wt % pentafluorobenzenethiol ethanol solution for eight minutes, and modification of a surface of the SD electrodes was performed.

Next, an organic semiconductor solution was applied to the entire surface of the substrate by dip coating. For the organic semiconductor solution, a solution diluted with toluene so as to set TIPS pentacene to 1.0 wt % and set polystyrene to 0.5 wt % was used. In dip coating, pulling of 1 mm at a pulling speed 30 mm/s and holding for 10 seconds were repeatedly performed, and a semiconductor solution was applied.

After the application, a 4 wt % "BIOSURFINE (registered trademark)-AWP" (manufactured by Toyo Gosei Co., Ltd.) aqueous solution was spin-coated on the entire surface of the substrate. Spin coating was performed at a rotation speed of 1500 rpm for 30 seconds. Next, the i line was radiated at irradiation intensity of 80 mJ/$cm^2$ via a mask. After exposure, by dipping the substrate in pure water and applying an ultrasonic wave, development of a "BIOSURFINE (registered trademark)-AWP" film was performed. Next, the substrate was dipped in toluene, and patterning of the semiconductor layer was performed. Lastly, an organic transistor was acquired by performing heat treatment at 105° C. for 28 hours.

<Characteristic Evaluation of Organic Transistor>

The acquired organic transistor had a channel width of 500 μm and a channel length of 40 μm, and a malfunction in terms of appearance was not confirmed for each member on the substrate. When continuity between the gate electrode and the source/drain electrodes was measured by a tester, a leak current was not confirmed.

Figure 14:
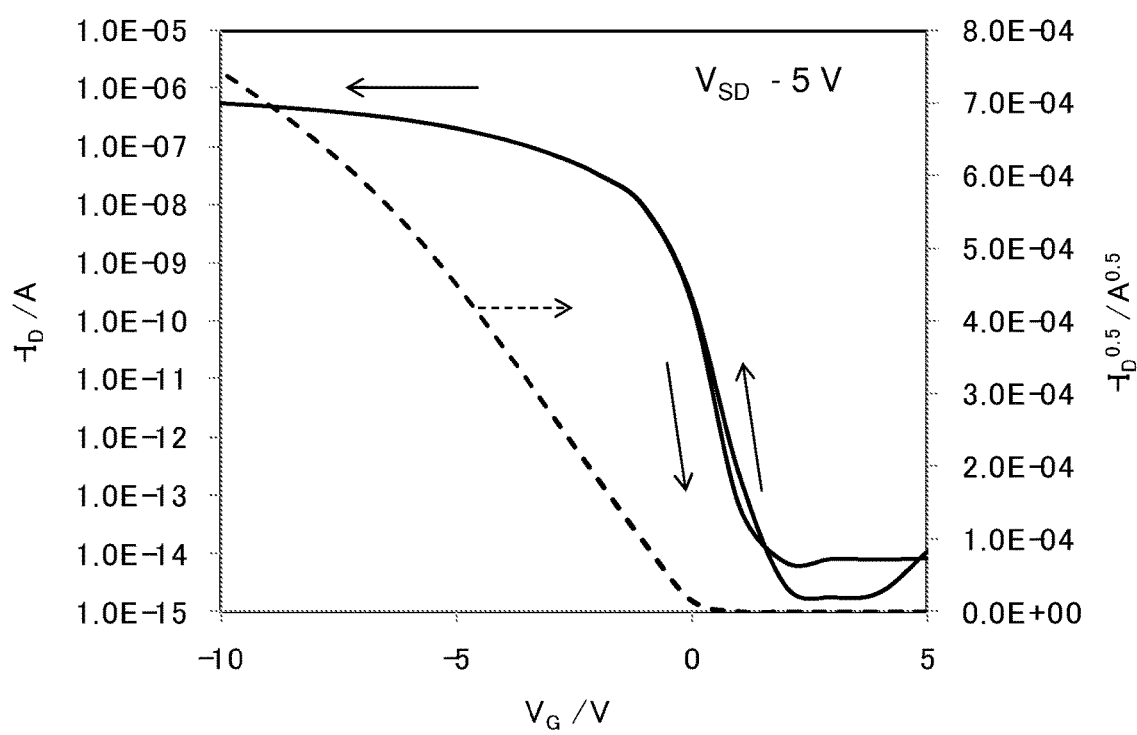
FIG. 14 is a graph illustrating a transmission characteristic of a transistor according to an example.
Figure 15:
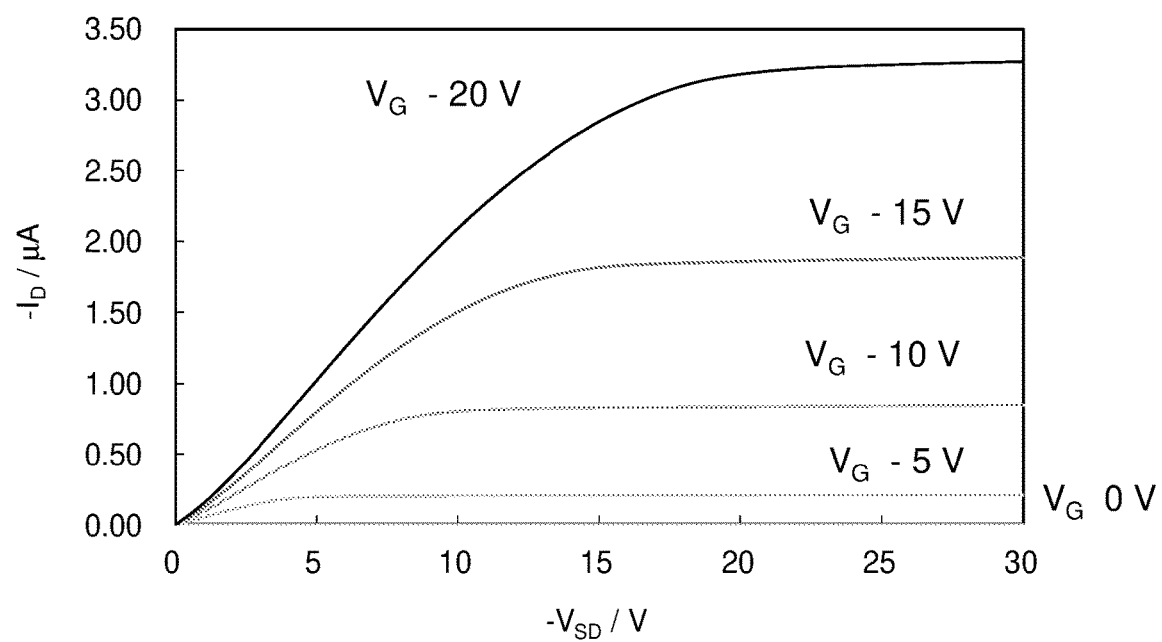
FIG. 15 is a graph illustrating an output characteristic of the transistor according to the example.

Next, a characteristic of the acquired organic transistor was evaluated by using a semiconductor parameter analyzer (4145B manufactured by Hewlett-Packard Japan, Ltd.). FIG. 14 is a graph illustrating a transmission characteristic of the organic transistor, and FIG. 15 is a graph illustrating an output characteristic of the organic transistor. A gate voltage of 0 to 40 V was applied to the gate electrode of the organic transistor, and a voltage of 0 to 50 V was applied between the source and the drain, and a current flowed. Mobility of the organic transistor was 0.4 $cm^2$/Vs. Note that a horizontal arrow in FIG. 14 indicates which vertical axis is used as a reference by each of a solid line and a dotted line in FIG. 14. It was clear from a result in FIGS. 14 and 15 that the transistor produced in the present example operated in an excellent manner.

REFERENCE SIGNS LIST

10 Substrate
12, 76 Metal film (gate electrode)
14, 34, 58 Resist
16, 22, 36, 48, 60, 72 Mask
18, 24, 38, 50, 62, 74 Opening
20, 70 Insulator layer
26, 40, 64 Oxide film
28, 52 Plating base film
30, 54 Plating catalyst
32, 32a, 32b, 32c, 56, 56a, 56b Electroless plating film (first metal layer)
42, 66 Electroless gold plating film (second metal layer)
44, 68 Semiconductor layer
46 Photosensitive water-soluble resin layer

What is claimed is:

1. A method for manufacturing a transistor being a bottom-gate transistor, the method comprising:
   a step of forming a first metal layer on an insulator layer provided on a substrate including a gate electrode or on a semiconductor layer provided on a substrate including a gate electrode and an insulator layer;
   a patterning step of applying a resist onto the first metal layer, and patterning the first metal layer by a photolithographic method;
   an oxide film removal step of removing an oxide film formed on the patterned first metal layer; and
   a step of forming a source electrode and a drain electrode by forming a second metal layer on the first metal layer after the oxide film removal step.

2. The method for manufacturing a transistor according to claim 1, further comprising:
   a drying step of drying the substrate after the patterning step of patterning the first metal layer, wherein
   the oxide film removal step is performed after the drying step.

3. The method for manufacturing a transistor according to claim 1, wherein
   the first metal layer is formed by first electroless plating.

4. The method for manufacturing a transistor according to claim 1, wherein
   the second metal layer is formed by second electroless plating.

5. The method for manufacturing a transistor according to claim 1, wherein
   a metal material of the first metal layer is nickel-phosphorus.

6. The method for manufacturing a transistor according to claim 1, wherein
   a metal material of the second metal layer is gold.

7. The method for manufacturing a transistor according to claim 1, wherein
   an energy level difference between a work function of a metal material used for the second metal layer and an energy level of a molecular orbital used for an electron movement in a formation material of the semiconductor layer is smaller than an energy level difference between a work function of a metal material used for the first metal layer and the energy level of the molecular orbital.

8. The method for manufacturing a transistor according to claim 1, wherein
the oxide film is removed by bringing the patterned first metal layer into contact with an acid solution in the oxide film removal step.

9. The method for manufacturing a transistor according to claim 1, wherein
the semiconductor layer is formed of an organic semiconductor.

10. A method of manufacturing a transistor, the transistor comprising a bottom-gate transistor, the method comprising:
applying a photo-curable resin over a gate electrode provided on a substrate;
curing the photo-curable resin by irradiating a predetermined pattern light and thereby forming an insulator layer having an opening where the gate electrode is exposed;
forming a base film for electroless plating by covering the insulator layer and the gate electrode exposed from the opening;
removing an oxide film formed on the gate electrode exposed from the opening after the forming the base film for electroless plating;
forming a first metal layer on the insulator layer and the gate electrode exposed from the opening by first electroless plating after the removing an oxide film formed on the gate electrode;
applying a resist onto the first metal layer, and patterning the first metal layer by a photolithographic method;
removing an oxide film formed on the patterned first metal layer; and
forming a wiring line that applies a voltage to the gate electrode, a source electrode, and a drain electrode by forming a second metal layer on the first metal layer by second electroless plating after the removing the oxide film formed on the patterned first metal layer.

11. The method of manufacturing a transistor according to claim 10, further comprising:
drying the substrate after the patterning the first metal layer and prior to the removing the oxide film formed on the patterned first metal layer.

12. The method of manufacturing a transistor according to claim 10, wherein a metal material of the first metal layer is nickel-phosphorus.

13. The method of manufacturing a transistor according to claim 10, wherein a metal material of the second metal layer is gold.

14. The method of manufacturing a transistor according to claim 10, wherein an energy level difference between a work function of a metal material used for the second metal layer and an energy level of a molecular orbital used for an electron movement in a formation material of the semiconductor layer is smaller than an energy level difference between a work function of a metal material used for the first metal layer and the energy level of the molecular orbital.

15. The method for manufacturing a transistor according to claim 10, wherein the oxide film is removed by bringing the patterned first metal layer into contact with an acid solution in the removing an oxide film formed on the patterned first metal layer.

16. The method for manufacturing a transistor according to claim 10, wherein the semiconductor layer comprises an organic semiconductor.

* * * * *